United States Patent
Gunner et al.

(10) Patent No.: US 8,026,871 B2
(45) Date of Patent: Sep. 27, 2011

(54) ELECTROLUMINISCENT DISPLAY AND DRIVER CIRCUIT TO REDUCE PHOTOLUMINESENCE

(75) Inventors: Alec G. Gunner, Cambridgeshire (GB); Euan Smith, Cambridgeshire (GB); Jonathan J. M. Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 773 days.

(21) Appl. No.: 10/513,300

(22) PCT Filed: Apr. 28, 2003

(86) PCT No.: PCT/GB03/01784
§ 371 (c)(1), (2), (4) Date: May 23, 2005

(87) PCT Pub. No.: WO03/094140
PCT Pub. Date: Nov. 13, 2003

(65) Prior Publication Data
US 2006/0050032 A1    Mar. 9, 2006

(30) Foreign Application Priority Data
May 1, 2002 (GB) .................................. 0210013.9

(51) Int. Cl.
*G09G 3/30* (2006.01)
(52) U.S. Cl. ............................... 345/76; 345/77; 345/83
(58) Field of Classification Search .......... 345/204–205, 345/55, 58, 76–80, 82–83
See application file for complete search history.

(56) References Cited

U.S. PATENT DOCUMENTS

| | | | |
|---|---|---|---|
| 4,539,507 A | 9/1985 | VanSlyke et al. | 313/504 |
| 5,049,780 A | 9/1991 | Dobrowolski et al. | 313/509 |
| 5,294,870 A | 3/1994 | Tang et al. | |
| 5,684,365 A | 11/1997 | Tang et al. | 315/169.3 |
| 5,719,589 A * | 2/1998 | Norman et al. | 345/82 |

(Continued)

FOREIGN PATENT DOCUMENTS

DE    100 42 974 A1    3/2002
(Continued)

OTHER PUBLICATIONS

Dynamics of Photoexcitations in Electric Fields in Poly(*p*-phenylenevinylene) Diodes, Lemmer et al., Synthetic Metals 67, 1994, pp. 169-172.

(Continued)

*Primary Examiner* — Jason Mandeville
(74) *Attorney, Agent, or Firm* — Marshall, Gerstein & Borun LLP

(57) ABSTRACT

This invention generally relates to display driver circuits for electro-optic displays, and more particularly relates to circuits and methods for reducing the re-emission of absorbed light, for example to increase the color gamut of organic light emitting diode displays. A driver for a display comprising a plurality of light emitting diode display elements, the driver comprising addressing circuitry to address said display elements, a first driver to cooperate with said address circuitry to provide a forward drive to at least one of said display elements to illuminate the display element, and a second driver to provide a reverse bias drive to others of said display elements at the same time as said at least one display element is illuminated to reduce a level of photoluminescence from said others of said display elements.

28 Claims, 13 Drawing Sheets

U.S. PATENT DOCUMENTS

| | | | | |
|---|---|---|---|---|
| 5,844,368 | A | * | 12/1998 | Okuda et al. ............... 315/169.3 |
| 5,965,901 | A | | 10/1999 | Heeks et al. .................... 257/40 |
| 6,014,119 | A | | 1/2000 | Staring et al. .................. 345/82 |
| 6,191,764 | B1 | * | 2/2001 | Kono et al. ..................... 345/76 |
| 6,201,520 | B1 | | 3/2001 | Iketsu et al. ..................... 345/76 |
| 6,211,613 | B1 | | 4/2001 | May ............................. 313/504 |
| 6,222,323 | B1 | | 4/2001 | Yamashita et al. ......... 315/169.3 |
| 6,332,661 | B1 | | 12/2001 | Yamaguchi .................. 317/108 |
| 6,429,837 | B1 | | 8/2002 | Ishizuka et al. .............. 345/74.1 |
| 6,534,925 | B2 | * | 3/2003 | Kawashima ............... 315/169.1 |
| 6,667,729 | B2 | * | 12/2003 | Redecker ........................ 345/82 |
| 6,750,833 | B2 | | 6/2004 | Kasai .............................. 345/76 |
| 7,091,939 | B2 | | 8/2006 | Kasai .............................. 345/76 |
| 7,537,947 | B2 | * | 5/2009 | Smith et al. ..................... 438/29 |
| 2002/0008694 | A1 | * | 1/2002 | Miyachi et al. ............... 345/204 |
| 2002/0027537 | A1 | | 3/2002 | Redecker ........................ 345/82 |

FOREIGN PATENT DOCUMENTS

| | | |
|---|---|---|
| EP | 1 079 361 A1 | 2/2001 |
| EP | 1 087 444 A2 | 3/2001 |
| EP | 1 091 339 A2 | 4/2001 |
| EP | 1 091 339 A3 | 4/2001 |
| EP | 1 093 322 A1 | 4/2001 |
| EP | 1 094 438 A1 | 4/2001 |
| JP | 6-301355 | 10/1994 |
| JP | 11-305727 | 11/1999 |
| KR | 2002-0022572 | 3/2002 |
| WO | WO 90/13148 | 11/1990 |
| WO | WO 95/06400 | 3/1995 |
| WO | WO 98/41065 | 9/1998 |
| WO | WO 99/48160 | 9/1999 |
| WO | WO 99/65012 A2 | 12/1999 |
| WO | WO 99/65012 A3 | 12/1999 |
| WO | WO-01/63586 | 8/2001 |

OTHER PUBLICATIONS

"Proposed Diffuse Ambient Contrast Measurement Methods for Flat Panel Displays", Kelley, U.S. National Institute of Standards and Technology Document NISTIR 6738, Apr. 2001, pp. 1-6.

Search Report in GB 0210013.9 dated Oct. 23, 2002.

Examination Report for Application No. EP03727625.0, dated Jul. 19, 2007.

Mach et al., "Physics and Technology of Thin Film Electroluminescent Displays," *Semicond. Sci. Technolog.*, 6:305-323 (1991).

Korean Office Action for Korean Application No. 10-2004-7017604, dated Feb. 26, 2010 (Partial English translation attached).

* cited by examiner

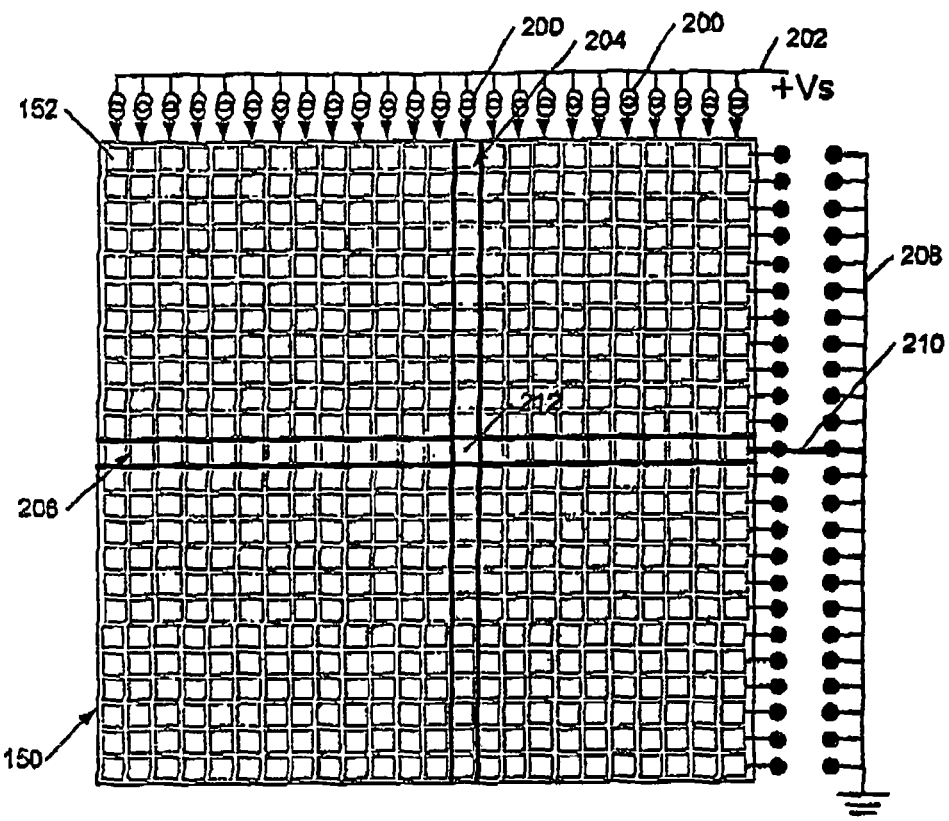
Figure 2a
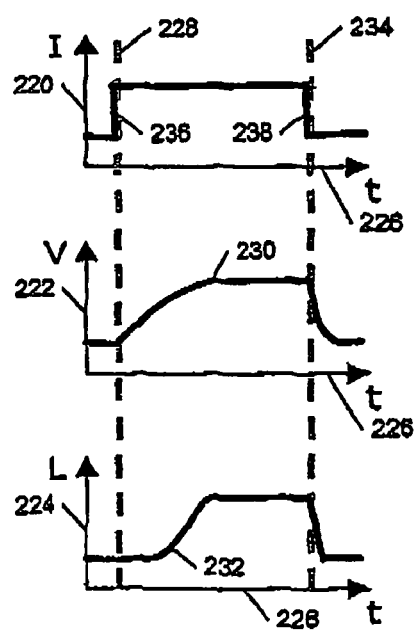
Figure 2b
Figure 2c
Figure 2d

Refer back to Figure 5 for basic driver

ELECTROLUMINISCENT DISPLAY AND DRIVER CIRCUIT TO REDUCE PHOTOLUMINESENCE

BACKGROUND OF THE INVENTION

1. Field of the Invention

This invention generally relates to display driver circuits for electro-optic displays, and more particularly relates to circuits and methods for reducing the re-emission of absorbed light, for example to increase the colour gamut of organic light emitting diode displays.

2. Related Technology

Organic light emitting diodes (OLEDs) comprise a particularly advantageous form of electro-optic display. They are bright, colourful, fast-switching, provide a wide viewing angle and are easy and cheap to fabricate on a variety of substrates. Organic LEDs may be fabricated using either polymer or small molecules in a range of colours (or in multi-coloured displays), depending upon the materials used. Examples of polymer-based organic LEDs are described in WO 90/13148, WO 95/06400 and WO 99/48160; examples of so called small molecule based devices are described in U.S. Pat. No. 4,539,507.

A base structure 100 of a typical organic LED is shown in FIG. 1a. A glass or plastic substrate 102 supports a transparent anode layer 104 comprising, for example, indium tin oxide (ITO) on which is deposited a hole transport layer 106, an electroluminescent layer 108, and a cathode 110. The electroluminescent layer 108 may comprise, for example, a PPV (poly(p-phenylenevinylene)) and the hole transport layer 106, which helps match the hole energy levels of the anode layer 104 and electroluminescent layer 108, may comprise, for example, PEDOT:PSS (polystyrene-sulphonate-dope polyethylene-dioxythiopene). Cathode layer 110 typically comprises a low work function metal such as calcium and may included an additional layer immediately adjacent electroluminescent layer 108, such as a layer of aluminum, for improved electron energy level matching. Contact wires 114 and 116 and to the anode the cathode respectively provide a connection to a power source 118. The same base structure may also be employed for small molecule devices.

Other examples of materials which may be employed for layer 108 include poly(2-methoxy-5-(2'-ethyl)hexloxyphe-nylene-vinylene)("MEH-PPV"), a PPV derivative (e.g. a di-alkoxy or di-alkyl derivative), a polyfluorene and/or a co-polymer incorporating polyfluorene segments, PPVs and/or related co-polymers, poly(2,7-(9,9-di-n-octyfluorene)-(1,4-phenylene-((4-secbutylphenyl)imino)-1,4-phenylene)) ("TFB"), ("PFB") poly(2,7-(9,9-di-n-octyfluorene)-(1,4-phenylene-((4-methylphenyl)imino)-1,4-phenylene-((4-methylphenyl)imino)-1,4-phenylene))("PFM"), poly(2,7-(9,9-di-n-octyfluorene)-(1,4-phenylene-((4-methoxyphenyl) imino)-1,4-phenylene-((4-methoxyphenyl)imino-1,4-phenylene)) ("PFMO"), poly(2,7-(9,9-di-n-octyfluorene) ("F8") or poly (2,7-(9,9-di-n-octyfluorene)-3,6-Benzothiadiazole) ("F8BT"). Alternatively a so-called small molecule such as tris-(8-hydroxyquinoline aluminum)("Alq3") as described in U.S. Pat. No. 4,539,507, may be employed.

In the example shown in FIG. 1a light 120 is emitted through transparent anode 104 and substrate 102 and such devices are referred to as "bottom emitters". Devices which emit through the cathode may also be constructed, for by keeping the thickness of cathode layer 110 less than around 50-100 nm so that the cathode is substantially transparent.

Organic LEDs may be deposited on a substrate in a matrix of pixels to form a single or multi-colour pixelated display. A multicoloured display may be constructed using groups of red, green, and blue emitting pixels. In such displays the individual elements are generally addressed by activating row (or column) lines to select the pixels, and rows (or columns) of pixels are written to, to create a display. So-called active matrix displays have a memory element, typically a storage capacitor and a transistor, associated with each pixel whilst passive matrix displays have no such memory element and instead are repetitively scanned, somewhat similarly to a TV picture, to give the impression of a steady image.

FIG. 1b shows a cross section through a passive matrix OLED display 150 in which like elements to those of FIG. 1a are indicated by like reference numerals. In the passive matrix display 150 the electroluminescent layer 108 comprises a plurality of pixels 152 and the cathode layer 110 comprises a plurality of mutually electrically insulated conductive lines 154, running into the page in FIG. 1b, each with an associated contact 156. Likewise the ITO anode layer 104 also comprises a plurality of anode lines 158, of which only one is shown in FIG. 1b, running at right angles to the cathode lines. Contacts (not shown in FIG. 1b) are also provided for each anode line. An electroluminescent pixel 152 at the intersection of a cathode line and anode line may be addressed by applying a voltage between the relevant anode and cathode lines.

Referring now to FIG. 2a, this shows, conceptually, a driving arrangement for a passive matrix OLED display 150 of the type shown in FIG. 1b, A plurality of constant current generators 200 are provided, each connected to a supply line 202 and to one of a plurality of column lines 204, of which for clarity only one is shown. A plurality of row lines 206 (of which only one is shown) is also provided and each of these may be selectively connected to a ground line 208 by a switched connection 210. As shown, with a positive supply voltage on line 202, column line; 204 comprise anode connections 158 and row lines 206 comprise cathode connections 154, although the connections would be reversed if the power supply line 202 was negative and with respect to ground line 208.

As illustrated pixel 212 of the display has power applied to it and is therefore illuminated. To create an image connection 210 for a row is maintained as each of the column lines is activated in turn until the complete row has been addressed, and then the next row is selected and the process repeated. Alternatively a row may be selected and an the column written in parallel, that is a row selected and a current driven onto each of the column lines simultaneously, to simultaneously illuminate each pixel in a row at its desired brightness. Although this latter arrangement requires more column drive circuitry it is preferred because it allows a more rapid refresh of each pixel. In a further alternative arrangement each pixel in a column may be addressed in turn before the next column is addressed, although this is not preferred because of the effect, inter alia, of column capacitance as discussed below. It will be appreciated that in the arrangement of FIG. 2a the functions of the column driver circuitry and row driver circuitry may be exchanged.

It is usual to provide a current-controlled rather than a voltage-controlled drive to an OLED because the brightness of an OLED is determined by the current flowing through it, this determining the number of photons it outputs in a voltage-controlled configuration the brightness can vary across the area of a display and with time, temperature, and age, making it difficult to predict how bright a pixel will appear when driven by a given voltage. In a colour display the accuracy of colour representations may also be affected.

FIGS. 2b to 2d illustrate, respectively, the current drive 220 applied to a pixel, the voltage 222 across the pixel, and the light output 224 from the pixel over time 226 as the pixel is address. The row containing the pixel is addressed and at the time indicated by dashed line 228 the current is driven onto the column line for the pixel. The column line (and pixel) has an associated capacitance and thus the voltage gradually rises to a maximum 230. The pixel does not begin to emit light until a point 232 is reached where the voltage across the pixel is greater than the OLED diode voltage drop. Similarly when the drive current is turned off at time 234 the voltage and light output gradually decay as the column capacitance discharges. Where the pixels in a row are all written simultaneously, that is where the columns are driven in parallel, the time interval between times 228 and 234 corresponds to a line scan period.

It is desirable to be able to provide a grayscale-type display, that is one in which the apparent brightness of individual pixels may be varied rather than simply set either on or off. In the context of this invention "grayscale" refers to such a variable brightness display, whether a pixel is white or coloured.

The conventional method of varying pixel brightness is to vary pixel on-time using Pulse Width Modulation (PWM). In the context of FIG. 2b above the apparent pixel brightness may be varied by varying the percentage of the interval between times 228 and 234 for which drive current is applied. In a PWM scheme a pixel is either full on or completely off but the apparent brightness of a pixel varies because of integration within the observer's eye.

Pulse Width Modulation schemes provide a good lines brightness response but to overcome effects related to the delayed pixel turn-on they generally employ a pre-charge current pulse (not shown in FIG. 2b) on the leading edge 236 of the driving current waveform, and sometimes a discharge pulse on the trailing edge 238 of the waveform. As a result, charging (and discharging) the column capacitance can account for half the total power consumption in displays incorporating this type of brightness control. Other significant factors which the applicant has identified as contributing to the power consumption of a display plus driver combination include dissipation within the OLED itself (a function of OLED efficiency), resistive losses in the row and column lines and, importantly in a practical circuit, the effects of a limited current driver compliance, as explained in more detail later.

FIG. 3 shows a schematic diagram 300 of a generic driver circuit for a passive matrix OLED display. The OLED display is indicated by dashed line 302 and comprises a plurality n of row lines 304 each with a corresponding row electrode contact 306 and a plurality m of column lines 308 with a corresponding plurality of column electrode contacts 310. An OLED is connected between each pair of row and column lines with, in the illustrated arrangement, its anode connected to the column line. A y-driver 314 drives the column lines 308 with a constant current and an x-driver 316 drives the row lines 304, selectively connecting the row lines to ground. The y-driver 314 and x-driver 316 are typically both under the control of a processor 318. A power supply 320 provides power to the circuitry and, in particular, to y-driver 314.

FIG. 4 shows a typical active matrix OLED driver circuit 400. A circuit 400 is provided for each pixel of the display and ground 402, $V_{ss}$ 404, row select 414 and column data 416 busbars are provided interconnecting the pixels. Thus each pixel has a power and ground connection and each row of pixels has a common row select line 414 and each column of pixels has a common data line 416.

Each pixel has an organic LED 406 connected in series with a driver transistor 408 between ground and power lines 402 and 404. A connection 409 of driver transistor 408 is coupled to a storage capacitor 410 and a control 412 couples gate 409 to column data line 416 under control of row select line 414. Transistor 412 is a field effect transistor (FET) switch which connects column data line 416 to gate 409 and capacitor 410 when row select line 414 is activated. Thus when switch 412 is on a voltage on column data line 416 can be stored on a capacitor 410. This voltage is retained on the capacitor for at least the frame refresh period because of the relatively high impedances of the gate connection to driver transistor 408 and of switch transistor 412 in its "off" state.

Driver transistor 408 is typically an FET transistor and passes a (drain-source) current which is dependent upon the transistor's gate voltage less a threshold voltage. Thus the voltage at gate node 409 controls the current through OLED 406 and hence the brightness of the OLED.

A voltage-driven active matrix display is described in U.S. Pat. No. 5,684,365 and a current-driven active matrix display is described in WO 99/65012. Other specific examples of OLED display drivers are described in U.S. Pat. No. 6,014,119, U.S. Pat. No. 6,201,520, U.S. Pat. No. 6,332,661, EP 1,079,361A and EP 1,091,339A; OLED display driver integrated circuits are also sold by Clare Micronix of Clare, Inc., Beverly, Mass., USA. The Clare Micronix drivers provide a current controlled drive and achieve grayscaling a conventional PWM approach; U.S. Pat. No. 6,014,119 describes a driver circuit in which pulse width modulation is used to control brightness, U.S. Pat. No. 6,201,520 describes driver circuitry in which each column driver has a constant current generator to provide digital (on/off) pixel control; U.S. Pat. No. 6,332,661 describes pixel driver circuitry it which a reference current generator sets the current output of a constant current driver for a plurality of columns, but this arrangement is not suitable for variable brightness displays; and EP 1,079, 361A and EP 1,091,339A both describe similar drivers for organic electroluminescent display elements in which a voltage drive rather than a current drive is employed.

Display technologies based upon inherently emissive devices, unlike, for example, LCDs, tend to have a bright and visually pleasing appearance. There is a continuing need to improve the visual contrast of emissive displays and OLED-based displays in particular, but it is not always clear what effects contribute to contrast reduction. The applicant has recognised that the electroluminescent material normally used in both organic and inorganic light emitting diodes are generally also photoluminescent, and that this photoluminescence can contribute to contrast reduction.

Photoluminescence is a phenomenon in which, broadly speaking, a material absorbs light at one wavelength and re-emits light at a longer wavelength. This photoluminescence can be difficult to observe, even under laboratory conditions, but has the effect of giving a display a less lively appearance, particularly under bright ambient light conditions, and especially outdoors in sunlight. The applicant has found that such contrast-reducing photoluminescence can be stimulated either by absorbed ambient light or by self-absorption particularly, for example, in a display comprising a plurality of pixels, where light from one pixel can cause a neighbouring nominally off pixel to photoluminesce. In a colour display this effect can also cause a colour shift, as described further later.

In more detail, referring to FIGS. 1a and 1b, incident ambient light passes through the substrate 102, transparent anode 104, and hole transport layer 106 to the layer of electroluminescent material 108 where it is absorbed generating excitons, that is bond electron-hole pairs. Alternatively excitons may be generated by light from nearby illuminated pixels propagating through the electroluminescent layer 108, and/or transparent anode layer 104, and/or hole transport layer 106, and/or substrate 102.

With no applied field a significant fraction of these optically excited excitons rapidly radiatively decay emitting light substantially isotropically according to the photoluminescence spectra of the material or materials forming layer 108. The fraction of the excitons decaying radiatively depends upon the photoluminescence efficiency of the material and upon the applied field. When diode formed by the device is in an off state—typically, but not necessarily, when the anode and the cathode are at the same electrical potential—layer 108 is in a quiescent photo-emitting state. Thus when the display is viewed an observer sees a combination of the emitted photoluminescence and reflected and/or scattered light from the display, both of which tend to reduce the display contrast.

Prior art contrast improving techniques have concentrated upon the use of anti-reflection devices, such as filters, the circular polariser described in U.S. Pat. No. 6,211,613 (WO97/38452) assigned to the present applicant, and the black anti-reflection cathode described in U.S. Pat. No. 5,049,780. However these techniques can be insufficient, for example reducing the desired light emission. Moreover these techniques are unable to reduce the level of self-stimulated photoluminescence.

Background prior art relating the improvement of colour purity in electroluminescent display is described in EP 1 087 444, which relates to separate red, green and blue gamma correction, and in EP 1 093 322, which relates to OLED device instruction.

The applicant has recognised that contrast in a light emitting diode-based display, such as a passive or active matrix OLED-based display, may be increased by reducing the contrast-reducing photoluminescence. Where the display comprises light emitting diodes, especially organic LEDs, this photoluminescence may be reduce or quenched by reverse biasing selected ones of the light emitting diodes, that is those LEDs not emitting at any particular moment in time.

The possibility of improving OLED display contrast by reducing or quenching photoluminescence has never previously been recognised. Schemes for applying reverse bias to OLED display are known in the prior art, but these are not intended or suitable for improving contrast by the reduction of photoluminescence. Consequently these prior at reverse biasing schemes exhibit some differences from those described below for contrast-improving photoluminescence reduction.

U. Lemmer et. al., Synthetic Metals, 67 (1994) 169-172 describes the experimental observation of the basic phenomenon of photoluminescence quenching in an ITO/PPV/A1 structure.

WO98/41065 discloses the application of either polarity of driving voltage to an electroluminescent polymer-based display to drive either red light emission from an interface of the polymer or green light emission from the bulk of the polymer. However, in both cases, the light emitting semiconductor is forward biased (the device effectively comprises two back-to-back diodes).

U.S. Pat. No. 6,201,520 describes the use of reverse biasing for non-selected pixels in a pixilated OLED display to prevent crosstalk which could otherwise be caused by the (electrically) semi-excited state of the non-selected pixels. However U.S. Pat. No. '520 does not specify any particular value of reverse bias drive and does not provide any teaching on the application of a reverse bias drive sufficient to provide an improved contrast display by photoluminescence quenching. Furthermore the mechanism for applying a reverse bias in U.S. Pat. No. '520 limits the reverse bias voltage to the forward bias voltage whereas, generally speaking, it is preferable to apply a larger reverse bias voltage than the forward voltage to achieve adequate photoluminescence reduction for improved contrast.

U.S. Pat. No. 5,965,901, assigned to the present applicant, describes the use of a pulse driving scheme for an organic light-emitting polymer device to improve device lifetime in which positive pulses are separated by negative (reverse bias) pulses. However this document does not contemplate applying reverse bias to some pixels at the same time as applying forward bias to others and is thus unsuitable for reducing photoluminescence stimulated by emission from pixels within the display. Furthermore again the document does not provide any teaching on the application of a reverse bias drive sufficient to provide an improved contrast display by photoluminescence quenching.

EP 1094438A describes the periodic application (for example, every frame) of reverse bias to reduce leakage current due to through-film shorts.

GENERAL DESCRIPTION

According to the present invention there is provided a driver for a display comprising a plurality of light emitting diode display elements, the driver comprising addressing circuitry to address said display elements, a first driver to cooperate with said address circuitry to provide a forward drive to at least one of said display elements to illuminate the display element, and a second driver to provide a reverse bias drive to others of said display elements at the same time as said at least one display element is illuminated to reduce a level of photoluminescence from said others of said display elements.

Reverse biasing some of the display elements while forward biasing others helps to improve contrast by reducing photoluminescence due to ambient light absorption and self-stimulation. Providing two drivers, one to provide a forward drive and the other for the reverse bias drive, simplifies the driving circuitry and facilitates reverse biasing some display elements whilst forward biasing others. For example providing two drivers for a passive matrix display allows even some pixels in a column selected for forward biasing to be reverse biased.

Preferably the first driver is a current driver such as a controllable or adjustable or modulatable substantially constant current driver, and the second driver is a voltage driver. A precision reverse bias voltage drive is not necessary, however, and thus the voltage driver need not be a constant voltage driver. Thus the first driver is preferably configured to provide a positive output with respect to a ground level, and the second driver to provide a negative output, positive in this context denoting a forward bias direction. Providing a forward current drive and a reverse voltage drive is appropriate to the functions of these two drives since a forward current drive assists in providing a consistent and/or controlled output whilst photoluminescence quenching, although needing a small, light-dependent current is, broadly speaking, a voltage driven effect. In order to be operable from a single-ended supply the driver preferably in incorporates means, such as an inverter or charge pump, to generate a negative supply voltage for the second driver to provide the reverse bias drive.

The driver may configured to provide pulse width modulation control of the brightness of a display element, for example by modulating a substantially constant current drive.

In such an arrangement some benefits of the invention may be obtained without reverse biasing some of the display elements at the same time as forward biasing others, since where the pixels are not all at their maximum brightness there will be periods when none of the pixels will be forward driven. A reverse bias may be applied during this period (or during these periods) to reduce the photoluminescence from ambient illumination rather than self-stimulation, to provide some improvement in contrast.

In one embodiment the driver is configured for driving a passive matrix display and has row and column drivers for addressing the pixels, either individually or a row (or column) at a time.

The visually observed degree of contrast improvement depends upon the brightness of the illumination, and also on its wavelength or spectral characteristics since photoluminescence occurs at a longer wavelength than the incident illumination. Preferably the reverse bias is sufficient for a visibly discernable improvement in display contrast under sunlight, which has a typical illuminance of 10,000 (or more) lux (for indirect sunlight) and 100,000 (or more) lux (for direct sunlight), and which has a spectrum approximating that of a black body at 5400K.

In another aspect the invention provides a display driver for a colour display, the display comprising at least two types of electroluminescent pixels, a first type of pixel having an emission peaked at a first wavelength and a second type, of pixel having an emission peaked at a second, longer wavelength, the display driver being configured to drive at least some of said first type of pixel on at a different time to pixels of said second type, and wherein the display driver is further configured to reverse bias at least some of said second type of pixel during the period when said at least some of said first type of pixel are drive on.

The pixels may be alternately or sequentially driven so that one set of pixels of a first colour is driven whilst a second set of pixels of a second colour, redder than the first, is reverse biased. The forward and reverse biasing may be performed, for example, under processor control, which can provide the advantage of being substantially transparent to a user of the display driver. Pulse width modulation brightness and/or colour control may also be incorporated. The reverse biasing may be accomplished sufficiently rapidly not to be noticed by a human observer of the display. The display may be of a passive matrix type or of an active matrix type or of some other type, for example a segmented display with a separate electrode for each display element or segment.

According to a related aspect of the invention there is also provided display driver circuitry for providing an improved contrast electroluminescent display, the electroluminescent display comprising a plurality of electroluminescent (EL) display elements, the display driver circuitry comprising a driver to apply a first polarity drive to at least one first display element of said EL display elements to cause said at least one first display element to electroluminescent; and means to apply a second polarity drive to at least one second display element of the EL display elements to at least partially quench photoluminescence from said at least one second display element, said first and second display elements comprising different display elements, said first and second polarity drives comprising opposite polarity drives, and said first and second polarity drives at least partially overlapping in time.

Preferably the driver is an adjustable, controllable, or modulatable substantially constant current driver. The photoluminescence may be quenched by, for example, 5%, 10%, 20%, 50% or more, preferably to provide a visible improvement in contrast. The display driver circuitry may provide an improvement in contrast of, for example, more than 1%, more the 5%, more than 10% or more than 20%, when the contrast is measured in accordance with an integrating sphere method, an open box method, or a sampling sphere method as described, for example, in US National Institute of Standards and Technology document NISTIR 6738, "Proposed Diffuse Ambient Contrast Measurement Methods for Flat Panel Displays", Edward F Kelley, April 2001.

The means to apply the second polarity drive may comprise voltage drive means, for example to provide a voltage drive of at least 5 volts, preferably at least 10 volts, and more preferably at least 20 volts. Alternatively the means to apply the second polarity drive may comprise means to correct the first polarity drive back to front across a said display element.

The electroluminescent display may be passive matrix display, the display driver circuitry then including row and column electrode driver circuitry. The driver a circuitry may be configured to reverse bias pixels with a row or column electrode in common with a forward driven display element or pixel.

In a related aspect the invention also provides a method of using a display driver to improve contrast in a display comprising a plurality of light emitting diode display elements, the method comprising operating the display driver to reverse-bias non-emitting display elements to at least partially quench photoluminescence from said non-emitting display elements whereby said display contrast is enhanced.

This method provides similar advantages to the above described display drives and may be employed to improve contrast in a multicolour display and, in effect to provide improved colour gamut. In the above method it will be understood that display elements which are at times non-emitting may nevertheless appear illuminated if at other times they are light-emitting, for example where display elements are rapidly drive on and off to give the appearances of be illuminated.

In another aspect the invention provides a use of a display driver to improve contrast in a display comprising a plurality of light emitting diode display elements, comprising using the display driver to reverse-bias non-emitting display elements to at least partially quench photoluminescence from said non-emitting display elements.

The invention further provides an active matrix multicolour display, the display comprising a plurality of light emitting diode display elements and a plurality of associated display element driver circuits, a said display element driver circuit being configured for providing both a forward and a reverse drive to the display element with which it is associated.

The invention also provides a method for improving the contrast of a multicolour organic electroluminescent display device, the display device comprising a plurality of organic electroluminescent elements, and a driving device for selectively controlling the current through each element and the bias voltage across each element such that each organic electroluminescent element may be selectively forward biased to cause light emission from said element, unbiased or reverse biased, the method being characterised in that when a selection of said organic electroluminescent element are forward biased a further selection of said organic electroluminescent elements are reverse biased at a voltage sufficient to quench the photoluminescent emission emitted from said further selection of electroluminescent elements.

There is further provided a method of increasing the colour gamut of an emissive colour display, the display comprising at least two types of electroluminescent pixels, a first type of pixel having an emission peaked at a first wavelength and a second type of pixel having an emission peaked at a second, longer wavelength, the method comprising reverse biasing at least some of said second type of pixel at least whilst some of said first type of pixel are illuminated.

In all the above drivers, driver circuits and methods the display preferably comprises organic light-emitting diode display elements. These may be arranged as a matrix, in either a single colour to provide a monochrome display, or in a matrix comprising groups of pixels of different colours to provide a multicolour display. Alternatively the OLED display elements may comprise separately driveable segments of a display such as a seven-segment numerical display or a multi-segment display dedicated to a particular application.

BRIEF DESCRIPTION OF THE DRAWINGS

These and other aspects of the invention will now be further described, by way of example only with reference to the accompanying figures in which:

FIGS. 2a to 2d show, respectively, a conceptual driver arrangement for a passive matrix OLED display, a graph of current drive against time for a display pixel, a graph of pixel voltage against time, and a graph of pixel light output against time;

FIG. 14 shows photoluminescent intensity as a function of illumination wavelength for the device of FIG. 13a.

DETAILED DESCRIPTION

The applicant has recognised that contrast in a light emitting diode-based display, such as a passive or active matrix OLED-based display, may be increased by reducing the contrast-reducing photoluminescence. Where the display comprises light emitting diodes, especially organic LEDs, this photoluminescence may be reduced or quenched by reverse biasing selected ones of the light emitting diode, that is those LEDs not emitting at any particular moment in time.

Figure 1A:
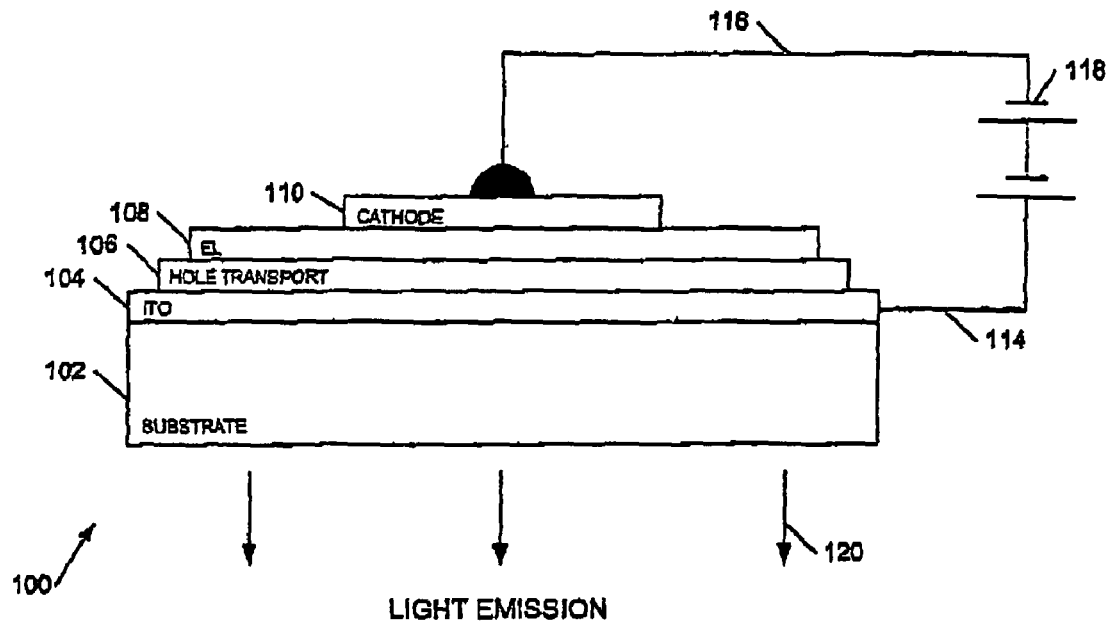
FIGS. 1a and 1b show cross sections through, respectively, an organic light emitting diode and a passive matrix OLED display.
Figure 1B:
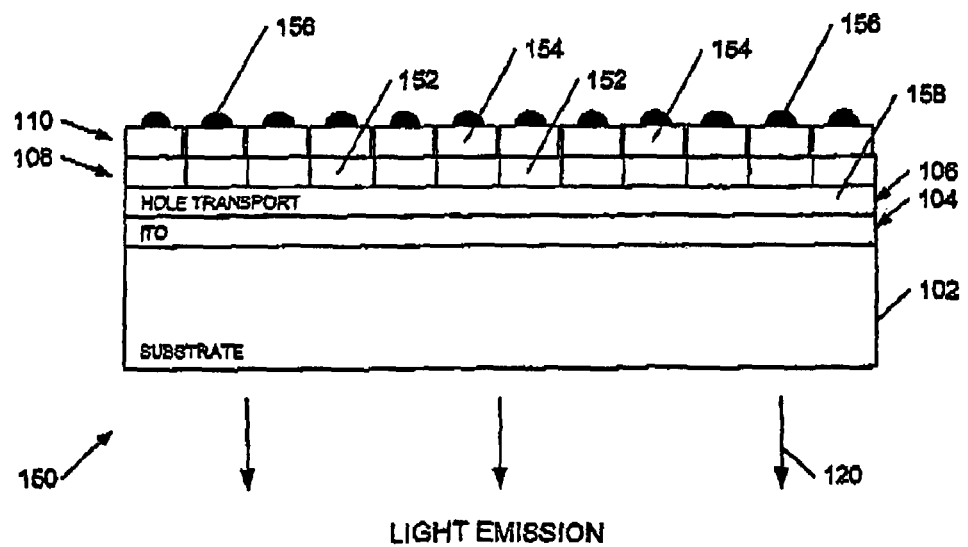

Consider, for example, a simple OLED display, such as that shown in FIG. 1a or 1b, with no forward or reverse bias applied. The apparent colour of the (non-illuminated) display is a combination of the colour of the photoluminescence from electroluminescent layer 108 of the display and the intrinsic colour of layer 108 and other layers, in particular the cathode layer, of the device. Thus where, for example, layer 108 is intrinsically colourless and photoluminesces in blue, under white ambient light the display (or non-forward driven pixels) will appear bluish with no bias, tending to reduce display contrast. However with a reverse bias applied the display (or non-illuminated pixels) will appear colourless or will have the cathode colour, hence allowing an increased contrast between pixel on and off states. Preferably the cathode is absorbing or black. Where the cathode is partially transparent, so that when the display (or a pixel) is off (not electroluminescing) a viewer may see through the cathode to what is behind, an absorbent or optically black layer may be provided behind the cathode.

Figure 5:
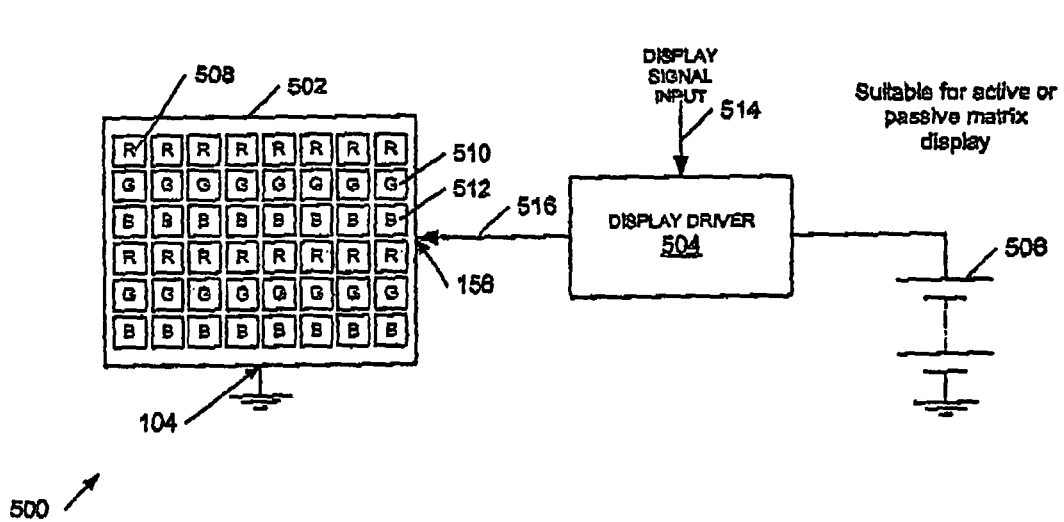
FIG. 5 shows a pixilated colour OLED display driver.

Referring now to FIG. 5, this shows an example of a pixilated display and driver structure 500. This broadly corresponds to the above described display structures except that the photoluminescent layer 108 is pixelated, that is it is divided into a plurality of separate display elements 502. Likewise the cathode layer (or layers) is divided into a plurality of separate cathodes each with its own contact. The substrate 102, anode 104, and hole transport layer 106 are, however, common to all the pixels. Thus an individual pixel may be switched off by applying a reverse bias between the common anode 104 and the appropriate cathode connection 156. In other pixelated displays X-Y pixel addressing may be employed using row and column electrodes.

In the arrangement of FIG. 5 the individual photoluminescent display elements have different colours to provide a colour display. For example blue pixels may be provided using blue photoluminescent material and red and green pixels may be provided by filtering white photoluminescent emission.

The display equipment includes display driver circuitry 504 and a power source illustratively shown by battery 506. The display 502 comprises a plurality of red 508, green 510, and blue 512 pixels arranged in a pattern which, from a distance, is capable of providing the appearance of a variable colour display. A variety of pixel patterns are possible in addition to the one shown to help reduce visual artifacts. For example a repeated pattern of four pixels, red, green and blue may be employed.

Display driver 504 receives a display signal input 514 and provides an output 516 to drive electrodes 156. As illustrated in FIG. 5 the common anode connection 104 and the negative terminal of the power source, battery 506, are both connected to ground. The display driver applies a positive voltage form power source 506 to a selected cathode connection in accordance with the display signal input on line 514. The display signal may comprise a single pixel on/off signal or may comprise an analogue or digital pixel brightness signal indicating a desired level of pixel brightness between the on and off states. In a colour display such as is illustrated separate signals are preferably provided for each red, green and blue pixel, to give the appearance of variable colour pixels.

The display driver may also incorporate means to provide an adjustable duty cycle pulse-width modulated (PWM) drive signal to each pixel responsive to the display signal input on line 514. The pulse modulated driving signal may have a zero or forward bias first current or voltage drive level and a second reverse bias voltage (or current) drive level. To reduce display flicker preferably the PWM signal should have a frequency of greater than 50 Hz, more preferably greater than 60 Hz, most preferably greater than 75 Hz. By selecting, for example, one of a plurality of mark-space ratios provided by a pulse generator the colour and luminescence or brightness of a pixel may be controlled.

Figure 6A:
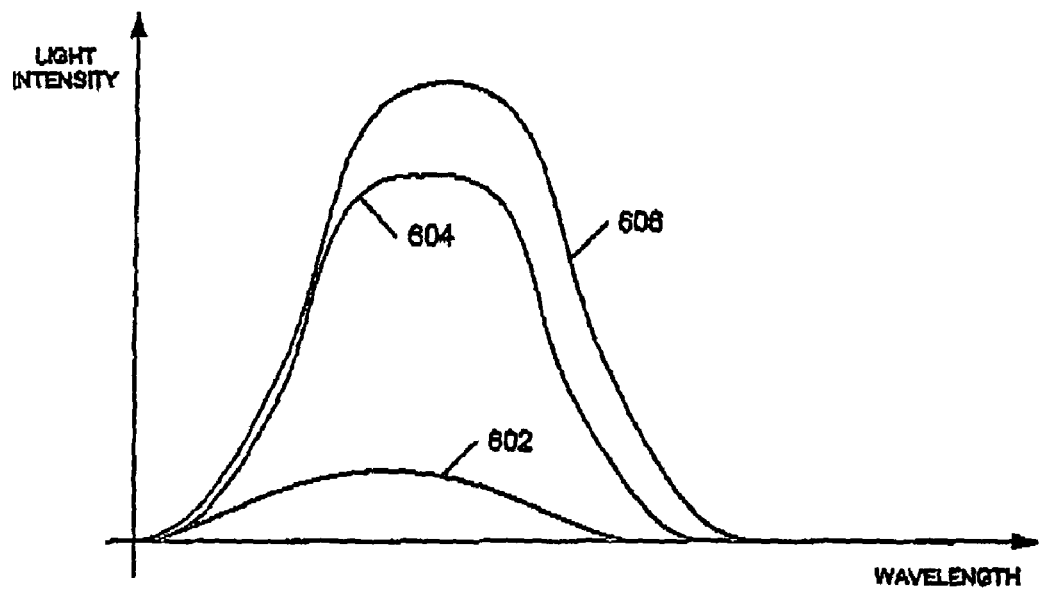
FIGS. 6a and 6b show spectra of electroluminescent materials illustrating photoluminescence quenching.
Figure 6B:
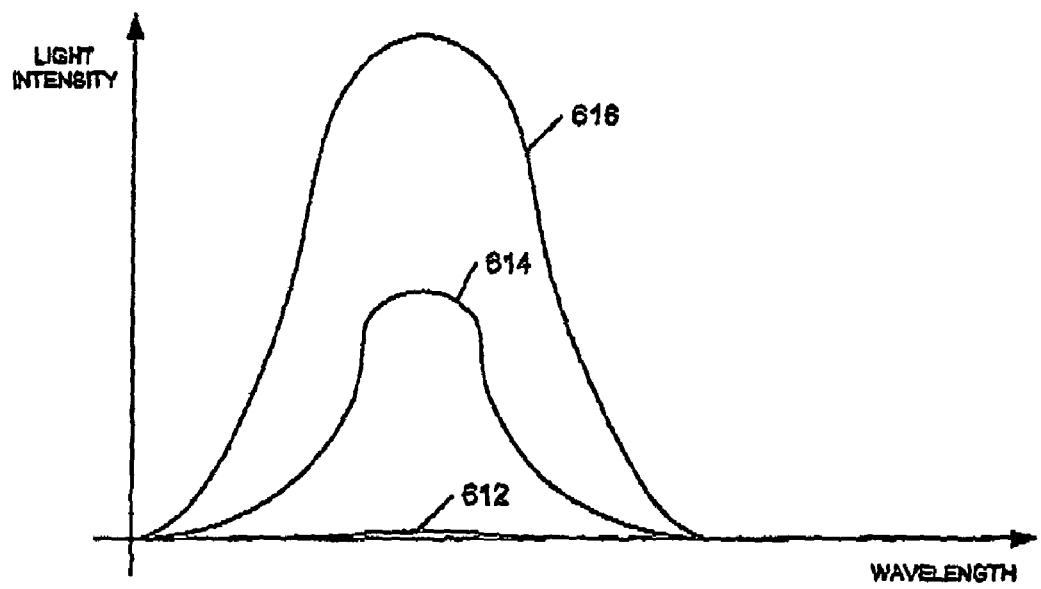

Referring now to FIG. 6, this shows exemplary spectra of two different types of electroluminescent material in FIGS. 6a and 6b. In FIGS. 6a and 6b the y-axis represents the intensity of light emitted from a device such as those shown in FIGS. 1a and 1b.

The spectrum of FIG. 6a is representative of materials which although having a relatively high photoluminescence efficiency also have a strong intrinsic colour. An example of such a material is the polymer blend P8BT-TFB, which has a photoluminescence efficiency of greater than 80%, photoluminescing yellow under white light, but also having intrinsic yellowish colour, so that the material looks yellow even when the photoluminescence is quenched. This residual or intrinsic colour arises because the material intrinsically absorbs a set of wavelengths which gives it a yellow appearance. This yellow colour is also apparent when the material is deposited as a thin film as the material's absorption is still a significant factor.

FIG. 6a shows three spectra 600 (not to scale) illustrating the variation of light intensity with wavelength for a material such as F8BT-TFB with an intrinsic colour. Spectrum 604 represents a photo-emission spectrum of a material in a device such as that shown in FIG. 1a or 1b with zero applied bias. With forward bias the spectrum shifts to spectrum 606, with an enhanced electroluminescent emission and a peak which is shifted towards longer (redder) wavelengths. When reverse bias is applied to a device containing a material the spectrum shifts to spectrum 602, showing that the photoluminescent light emission is reduced in intensity and that the peak wavelength is shifted toward the blue.

FIG. 6b, by contrast, shows a set of spectra 610 (not to scale) for a device containing a material with no intrinsic colour. Spectrum 614 shows the device photoluminescing with no applied bias, spectrum 616 the spectrum with forward bias applied with emission enhanced by electroluminescence, and spectrum 612 the spectrum with reverse bias applied to substantially quench the photoluminescence. As can be seen from FIG. 6b the positions of the peaks of spectra 612, 614 and 616 remain substantially constant as substantially the only contribution to the device's colour arises from the emitted photo/electroluminescence and not, as in FIG. 6a, from any contribution from the material's intrinsic colour.

The light from the display will generally include two components. A first component comprises the electro or photoluminescent emission itself and a second component arises from reflection or scattering of the ambient illumination by the display. This second component may be reduced by, for example, using a transparent or black cathode as described in U.S. Pat. No. 5,049,780 or by using a circular polarising filter as described in U.S. Pat. No. 6,211,613 (WO97/38452). In such devices relatively little light may be scattered from the photoluminescent layer itself, in which case the spectra of FIG. 6a may approach those of FIG. 6b.

Although these spectra, and a possible photoluminescence quenching mechanism described later, are discussed with reference to F8BT and TFB, these are merely given as examples to facilitate explanation. Applications of the invention are not limited to these materials, which may be employed with any electro/photoluminescent materials, including inorganic materials and, in particular, to any OLED-based devices.

Figure 7:
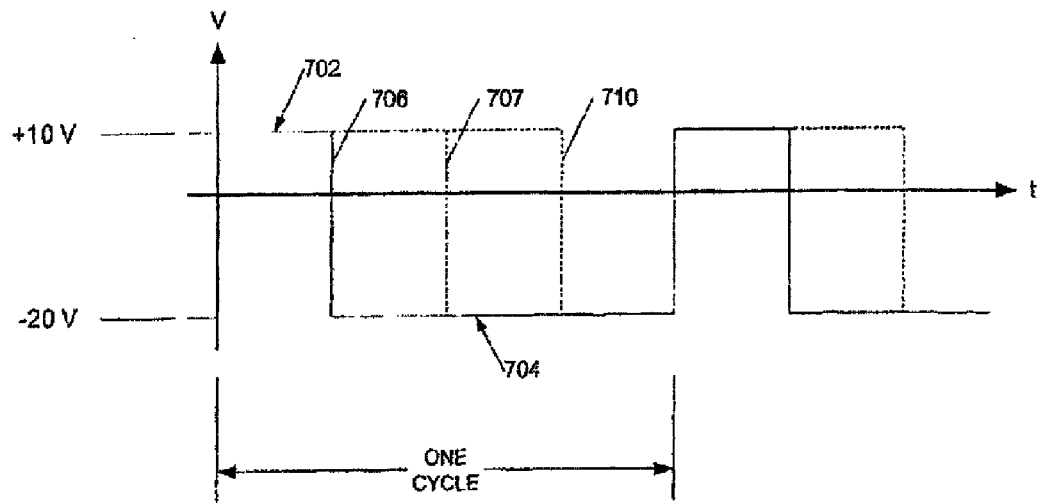
FIG. 7 shows a pixel driving waveform for photoluminescence quenching for improved display contrast.

Referring now to FIG. 7, this shows (not to scale) an exemplary pulse-width modulated (PWM) waveform 700, as is known in the art for use in controlling pixel brightness, but additionally incorporating a photoluminescence quenching phase. The waveform shows the voltage applied to a pixel against time, the voltage varying between a first forward bias level 702, in the illustrated example +10 volts, and a second reverse bias level 704, in the illustrated example −20 volts. This reverse bias level may correspond to the reverse bias needed for substantially complete photoluminescence quenching under typical operating conditions. Alternatively partial photoluminescence quenching, such as 5%, 10%, 20%, 50% or greater quenching, may be deemed sufficient to provide useful contrast enhancement. The portion of the waveform at voltage level 702 is referred as the "mark" and the portion of the waveform at level 704 as the "space". The waveform of FIG. 7 may be generated by the display driver circuitry 504 of FIG. 5.

In FIG. 7, for the purposes of simplifying the illustration the waveform is shown as alternating between forward and reverse voltage drive levels. However it will often be preferable to provide a substantially constant current forward drive arrangement, optionally adjustable or controllable, rather than a forward voltage drive. A reverse current drive may also be provided, although this is less preferable to a voltage drive as the pixel LEDs generally have a high impedance in reverse direction. Unlike the forward drive, which should preferably be carefully controlled to provide uniform display brightness, the exact level of reverse drive is not critical and need not be closely regulated.

During the mark portion of the waveform, the pixel luminescence and during the space portion of the waveform, any photoluminescence due to illumination by ambient light or other pixels is substantially quenched, thus increasing the apparent contrast of the display. Pulse width modulation brightness control is particularly suited to passive matrix displays. In such a passive matrix display, whilst one pixel is selected and forward biased, as previously described with reference to FIGS. 2a, 3 and 5, other pixels in the display may be reverse biased. Depending upon the switching and driving arrangement employed the reverse biased pixels may comprise pixels in other rows and/or columns to the row and/or column of the selected pixel or pixels or additional pixels in the same row and/or column as a selected pixel may also be revere biased.

The skilled person will further recognise that in a display driver with PWM-based brightness control it is straightforward to reverse bias all the pixels in the display during periods in the PWM waveform, such as period 704 in FIG. 7, when the selected pixel is itself reverse biased. This can be done, for example, by selecting all the pixels during period 704 when the selected pixel is off (and reverse biased) and driving all these pixels from a common bias generator or a plurality of revere bias generators or drivers.

The frequency of the PWM waveform is chosen so that rather than a pixel appearing to flash on and off, emission from the pixel appears substantially continuous, but with a brightness proportional to the on or mark period of the waveform. To achieve this, a frequency of at least 25 Hz to 50 Hz is generally required. It can be seen from that when the mark-to-space transition 706 is as shown, the pixel appears at approximately 25% of its full brightness. Transition positions 708 and 710 correspond, respectively, to pixel brightnesses of 50% and 75%, and 100% brightness corresponds to a steady state +10 volts (in the example) with a 100% mark:space ratio duty cycle. Waveforms other than that shown in FIG. 7 may also be used and, for example, the driving waveform need not have square edges.

As previously mentioned, using pulse width modulation has the advantage that there is a substantially linear relationship between the duty cycle and the apparent pixel brightness. Were the pixel brightness to be varied by varying the reverse bias voltage the characteristics of individual pixels would need to be relatively closely matched and some form of linerisation, such as a look-up table, might also be necessary. An additional or alternative form of brightness control comprises sub-dividing each pixel into n sub-pixels with area ratios in powers of 2 ($2^0$, $2^1$, $2^1$ etc), thus providing $2^n$ different brightness levels depending upon which sub-pixels are selected to be on.

In principle, every pixel in the display may have a different brightness to the other pixels and thus the display driver 504 of FIG. 5 should be capable of driving each pixel with a pulse width modulated waveform appropriate for its selected brightness. One way of achieving this is to provide a separate, variable pulse-width pulse generator for each pixel or for each row or column of pixels in the display. Integrated circuits which can be used for this purpose are available from the Clare Micronix subsidiary of Clare, Inc, California, USA and include the MED101 and MXED102. For, example, the MXED 102 is a 240 channel cascadable column driver providing 240 independently adjustable pulse width modulated outputs. Data sheets for these devices are available on the Clara Micronix website and are hereby incorporated by reference.

In operation it is believed that when the diode formed by the anode, cathode and electroluminescent layer is reverse biased, that is when the anode is held at a lower electrical potential than the cathode, a fraction of the excitons generated by incident ambient or other illumination are split into their constituent holes and electrons. These holes and electrons are then conducted out of the structure with the aid of the applied electric field. Thus this fraction of the excitons is prevented from radiatively decaying and hence emitting photoluminescence. The fraction of the excitons split apart in this way is determined by the reverse voltage applied to the device, and thus the level of photoluminescence can be controlled from a maximum value with no applied voltage to a reduced value depending upon the degree of reverse bias.

It will be appreciated that the additional power consumption of such a reverse-biased device is very low because, essentially, the only power required is that to conduct away the holes and electrons of the split exciton. This will vary depending upon the degree of incident illumination and upon the photoluminescence efficiency. It will also be appreciated that since a larger reverse bias is needed for greater photoluminescence reduction, the power consumption is to some degree dependent upon the degree of contrast required and upon the level of incident illumination. For example the reverse-bias power consumption will be higher in high ambient light conditions such as bright sunlight. The contrast improvement will be most apparent in materials which have both a high electroluminescent efficiency and a high photoluminescent-quenching efficiency. One example of such a material is F8BT-TFB.

Figure 3:
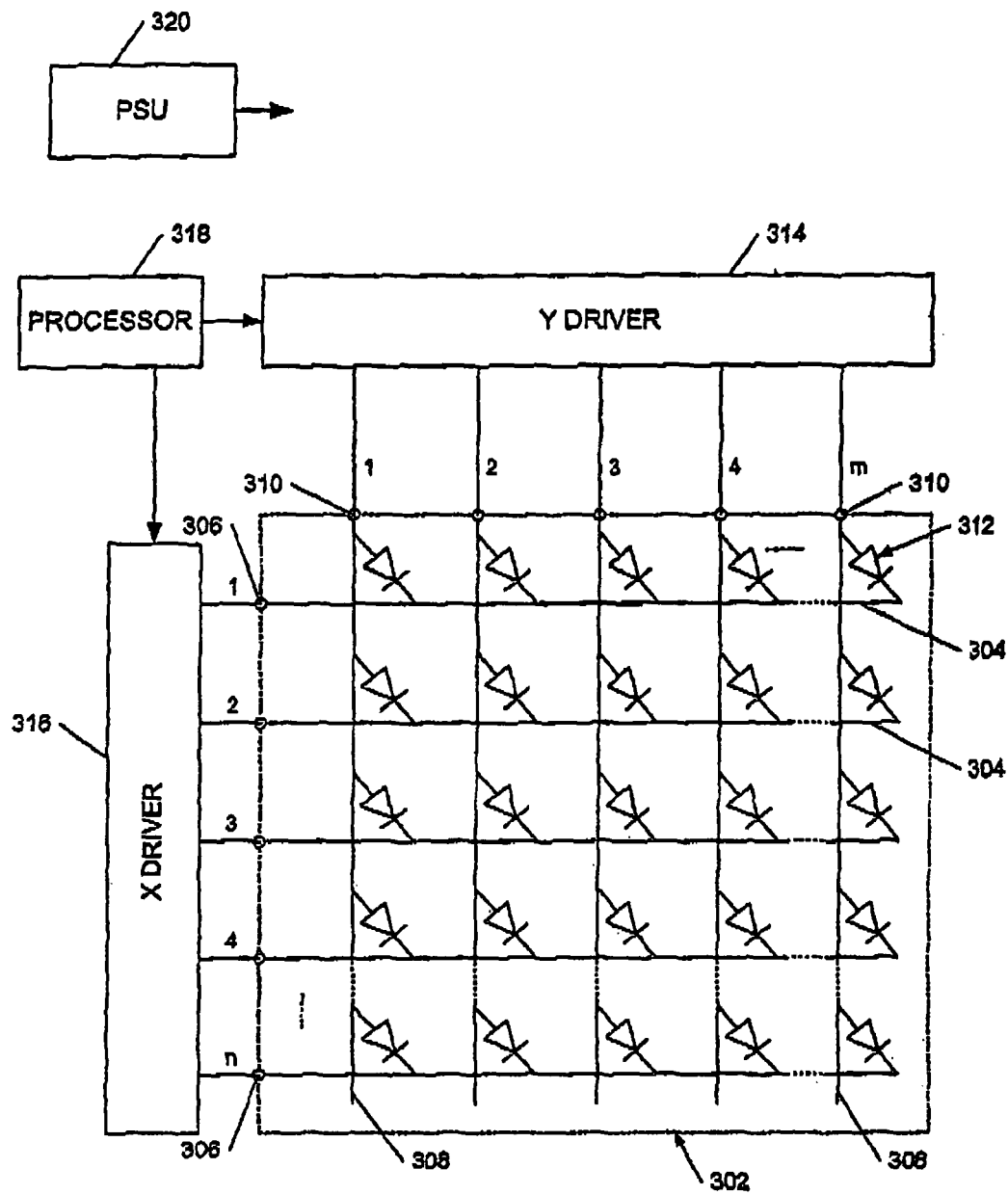
FIG. 3 shows a schematic diagram of a generic driver circuit for a passive matrix OLED display according to the prior art.
Figure 8B:
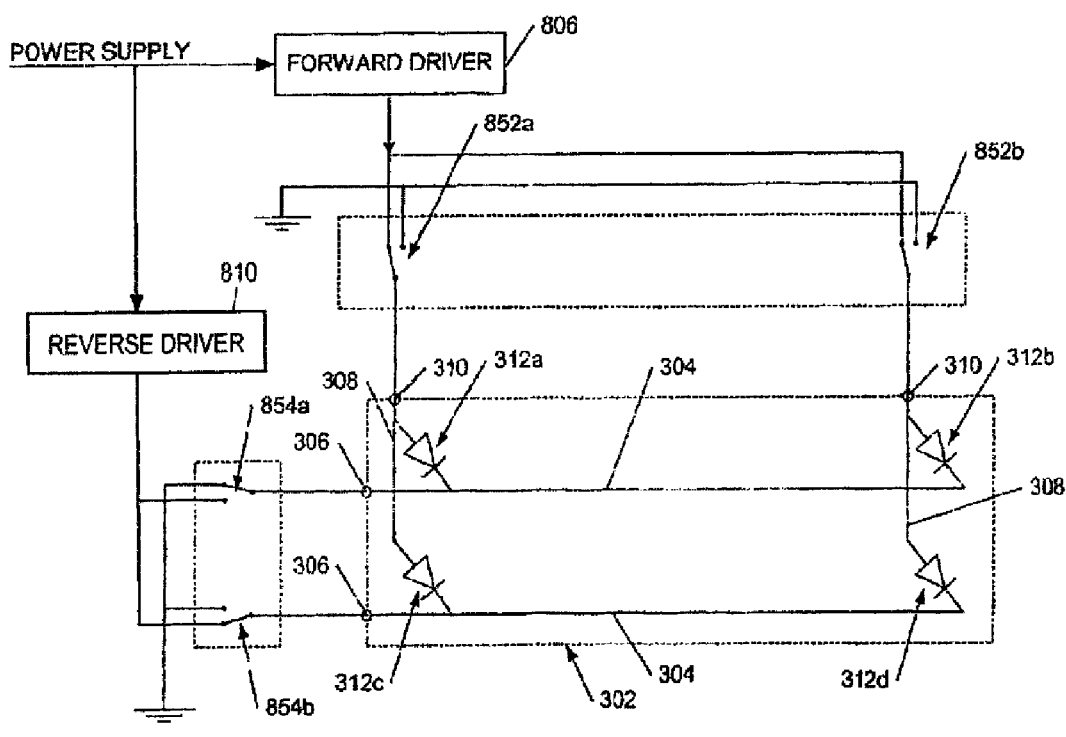
FIGS. 8a and 8b show first and second driver circuits for reverse biasing pixels of a passive matrix display.
Figure 8A:
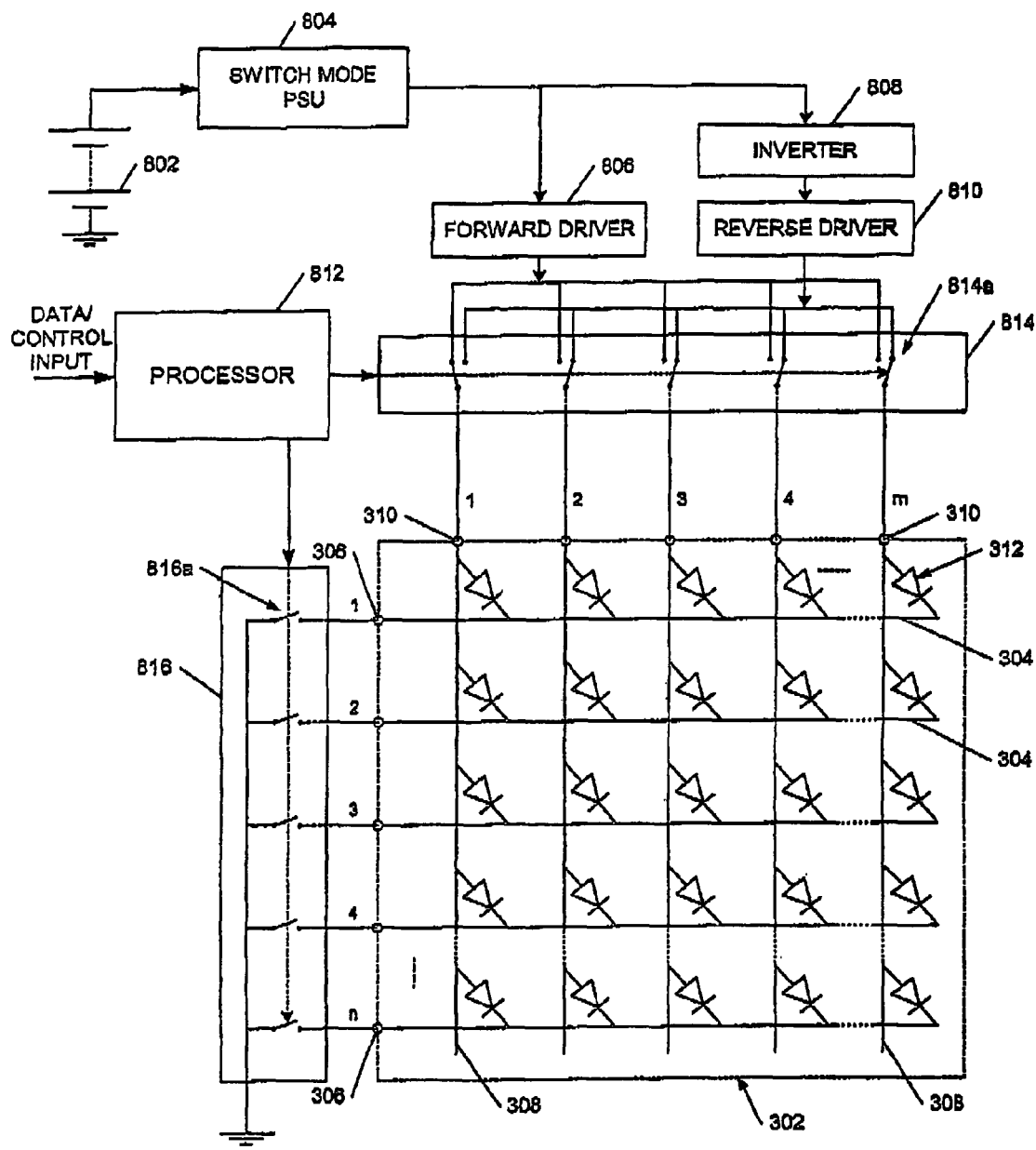

Referring now to FIG. 8*a*, this shows a driver circuit 800, similar to that of FIG. 3, but including means for reverse-biasing non-emitting pixels. The OLED display 302 corresponds to the OLED display of FIG. 3, and like features are indicated by like reference numerals. In FIG. 8*a* a battery 802 provides power to a switch mode power supply unit 804 to provide, efficiently, a regulated DC power output. A separate inverter 808 is used to generate a negative power supply voltage for reverse biasing. In a practical design inverter 808 may be combined with switch mode power supply 804, or inverter 808 may comprise a second switch mode power supply, or a charge pump, or any other conventional means of generating a negative power supply. Alternately a power supply derived from battery 802 may be split to provide positive, negative and ground reference voltages, or where, for example, the display is mains or similarly powered a conventional dual rail power supply may be employed.

The positive supply from power supply 804 supplies a forward driver 806 comprising, for example, a constant current generator. The negative voltage from inverter 808 supplies a reverse bias driver 810 typically a voltage driver, that is, a regulated or unregulated voltage source as opposed, for example, to a constant current source. The drive outputs from forward driver 806 and reverse driver 810 are provided to a column driver 814 including a plurality of switches 814*a*, one for each column electrode. Each switch is configured to connect a column electrode either to forward driver 806 or to reverse driver 810. A processor 812 has a data/control input for proving data for display to the display driver and has a first output for controlling the column driver 814 and in particularly switches 814*a*. A row driver 816 is also provided, including a plurality of switches 816*a*, each for selectively connecting a row electrode 306 of display 302 to ground. Switches 816*a* are likewise under control of processor 812.

In operation processor 812 controls row driver 816 to select a row of the passive matrix OLED display 302, that is to selectively connect a row to ground, and controls column driver 814 to selectively connect one or more of the column electrodes to forward driver 806. The pixel or pixels connected between the forward-driven column or columns and the selected row are thus forward-biased and emit light. The "unselected" columns are connected to reverse driver 810 and the "unselected" rows are also connected to ground to reverse bias the "off" pixels. It will therefore be appreciated that in a simplified arrangement row driver 816 may be dispensed with. Processor 812 may incorporate hardware and/or software for pulse width modulation brightness control of "on" pixels.

Referring now to FIG. 8*b*, this shows a conceptual schematic diagram of a variant 850 of the driver circuitry shown in FIG. 8*b*. As with driver circuitry 800 of FIG. 8*a* a forward driver 806 and a reverse driver 810 are provided, the forward driver preferably comprising a substantially constant source, albeit preferably adjustable or controllable for brightness control, and the reverse driver 810 preferably comprising a voltage drive.

As illustrated in FIG. 8*b*, switches 852*a* and 854*a* are connected to forward bias OLED pixel 312*a* into light emission. Likewise switch 852*b* also couples OLED pixel 312*b* to forward driver 806 which, being in the same row as pixel 312*a*, is also forward driven into light emission. Switch 854 (and the switches of other non-selected rows not shown in FIG. 8*b*) is, however, configured to connect the non-selected row (or rows) to reverse driver 810. Reverse driver 810 is configured to provide sufficient reverse bias drive that OLED pixels 312*c* and 312*d* are reverse biased even though their anodes are connected to forward driver 806. The output of reverse driver 810 may therefore be greater than the desired reverse bias by an amount approximately equal to the expected forward bias from forward driver 806. Where forward driver 806 is a current driver, the forward drive voltage will depend, among other things, on the OLED characteristics but, generally speaking, it is possible to estimate an approximate forward drive voltage output or range of outputs and then to provide a reverse bias voltage with an adequate margin.

The arrangement of FIG. 8b is useful in that it is normal to select a row and then drive many or all of the column electrodes simultaneously, to provide efficient refreshing of the display. It is therefore desirable to be able to apply reverse bias to non-selected pixels in such a situation.

It will be appreciated that in a segmented display or a combination display in which at least some of the display elements have separate drive electrodes, reverse biasing of unselected or non-emitting display elements is simply a matter of selecting either a forward or a reverse bias drive for application to respective electrodes of emitting and non-emitting display elements or segments.

A particular problem with the re-emission of absorbed light arises in the context of colour electroluminescent displays, as illustrated in FIG. 9. Ambient light and light of a shorter wavelength than a particular pixel colour can cause photoluminescence from a pixel. Thus, for example, when blue pixels are illuminated nearby red and green pixels photoluminesce and when green pixels are illuminated nearby red pixels photoluminesce.

Figure 9A:
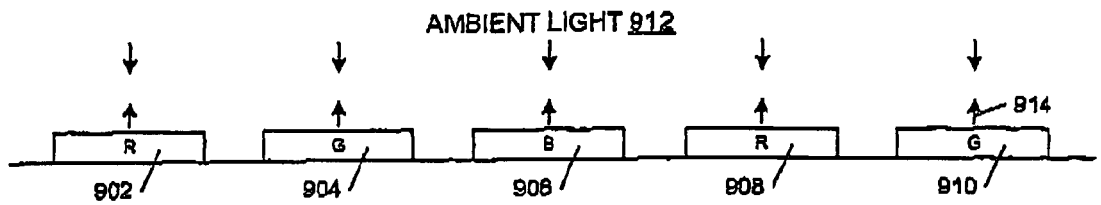
FIGS. 9a to 9f show, respectively, a non-illuminated, non-reverse biased cross-section through the colour display of FIG. 5; a blue-illuminated pixel with red and green photoluminescence; a blue illuminated pixel with red and green photoluminescence quenched by reverse biasing, a green illuminated pixel with red photoluminescence; a green illuminated pixel with red photoluminescence quenched by reverse biasing; and a red illuminated pixel.

FIG. 9a shows, schematically, red 902, 908, green 904, 910 and blur 906 pixels under ambient light 912. The ambient light 912 causes a low level of photoluminescence 914 from all the pixels.

Figure 9B:
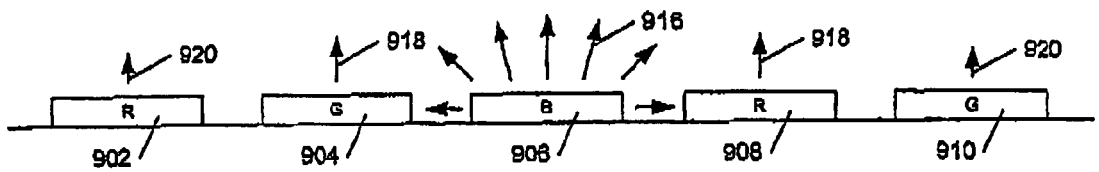
Figure 9C:
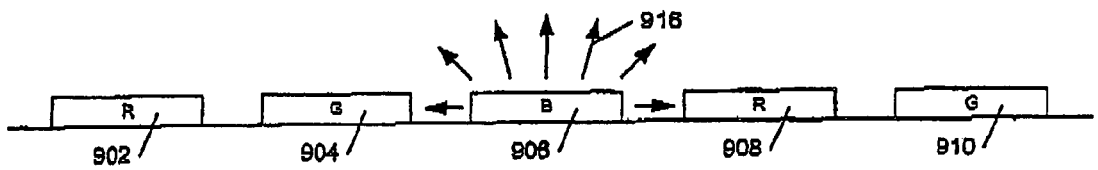
Figure 9D:
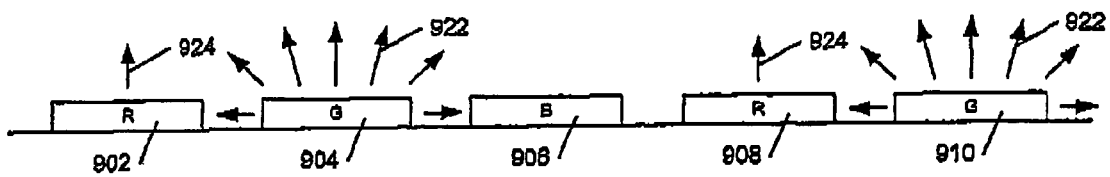
Figure 9E:
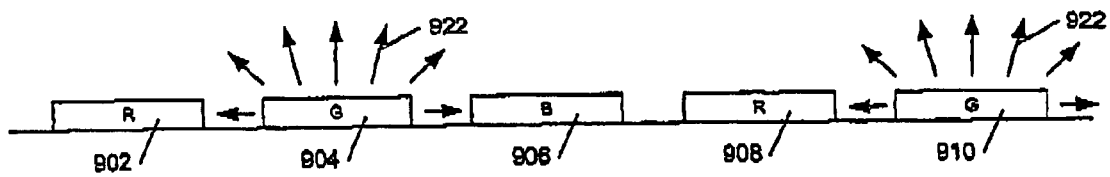
Figure 9F:
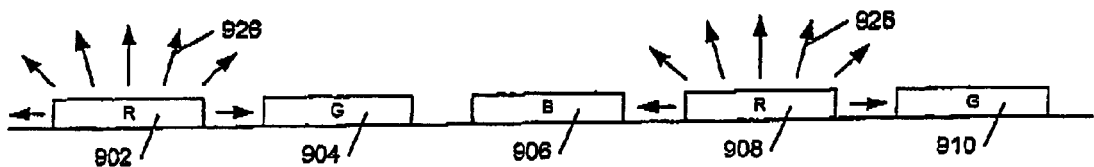

In FIG. 9b blue pixel 906 is forward driven to electroluminesce 916 and the red pixel 908 on one side of blue pixel 906 and the green pixels 904, 910 on another side of blue pixel 906 both photoluminesce 918. Similarly the slightly more distant red and green pixels 902, 910 also photoluminesce 920, albeit with a reduced intensity. In FIG. 9d green pixels 904 electroluminescent 922 causing adjacent red pixels 902, 908 to photoluminesce 924, although blue pixel 906 being of a shorter wavelength, is not stimulated to photoluminesce. In FIG. 9f red pixel 902, 908 are forward driven to electroluminescent 926 but the green and blue pixels 904, 906, 910 do not photoluminesce because they electro/photoluminesce at shorter wavelengths than the emission 926 of the red pixels 902, 908.

Figure 10:
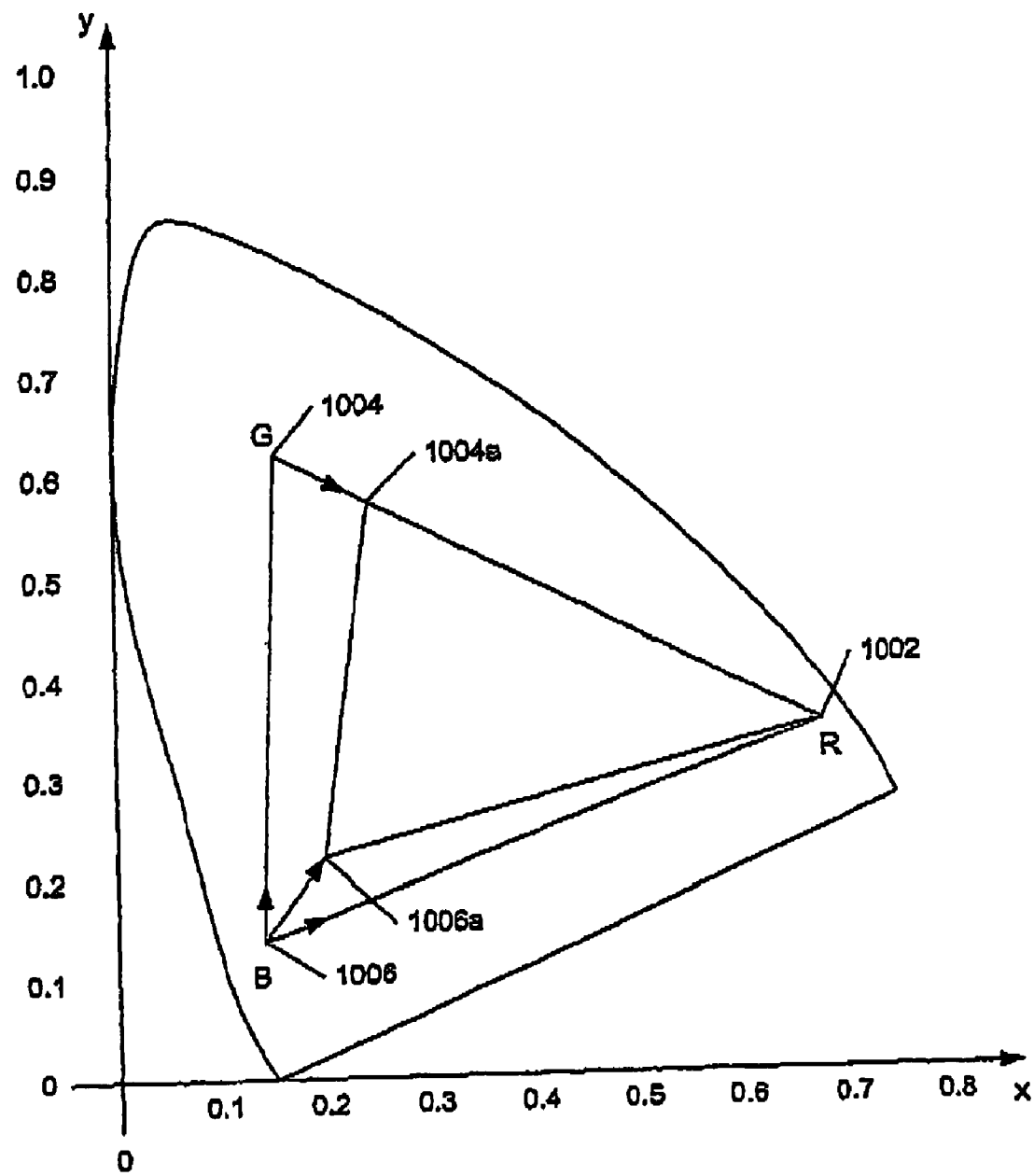
FIG. 10 shows a CIE colour space diagram illustrating contraction of the colour gamut of an OLED display due to photoluminescence.

FIG. 10 shows a CIE chromaticity diagram with ideal red, green and blue pixels colours marked at positions 1002, 1004 and 1006 respectively. The effect of the self-stimulated photoluminescence described above with reference to FIG. 9 is to move the blue color pixel position 1006 towards the green and red (see FIG. 9b) to position 1006a. Likewise the green colour pixel position 1004 is moved towards the red (FIG. 9d) to position 1004a. However the red colour pixel position 1002 is substantially unchanged (FIG. 9f). Therefore, as can be immediately seen from FIG. 10, the colour gamut of the display, that is the range of colours the display can produce, is reduced. It can further be appreciated that the effect of ambient illumination is broadly speaking, to shrink the colour gamut by moving each of pixel colour positions 1002, 1004 and 1006 inwardly towards white.

It will be appreciated from FIG. 10, that correspondingly, the colour gamut of a display incorporating photoluminescent display elements may be improved by at least partially quenching the photoluminescence, in particular self-simulated photoluminescence. FIG. 9c shows the effect of photoluminescence quenching applied to FIG. 9b, pixels 902, 904, 908, 910 having been reverse biased. Likewise FIG. 9e shows the effect of photoluminescence quenching applied to FIG. 9d, pixels 902 and 908 having been reverse biased. It can be seen that only selected pixels need to be reverse biased, in particular those pixels emitting at a longer wavelength than those currently driven. Thus when blue pixels are electroluminescing red and green pixels should be reverse biased and when green pixels are electroluminescing red pixels should be reverse biased, no reverse biasing being necessary when red pixels are electroluminescing. It will be appreciated that for improvement of the colour gamut of a display the photoluminescence need not be entirely quenched since partial quenching will result in at least some improvement in the colour gamut.

To allow a colour display to be provided in which, say, blue pixels are illuminated whilst red and green are quenched three sets of staggered waveforms 800 may be employed to ensure that only one colour of pixel is forward driven at any one time. This can be done by extending the cycle shown of FIG. 7, for example as shown in FIG. 11 to increase the reverse bias or "space" period 704.

Figure 11:
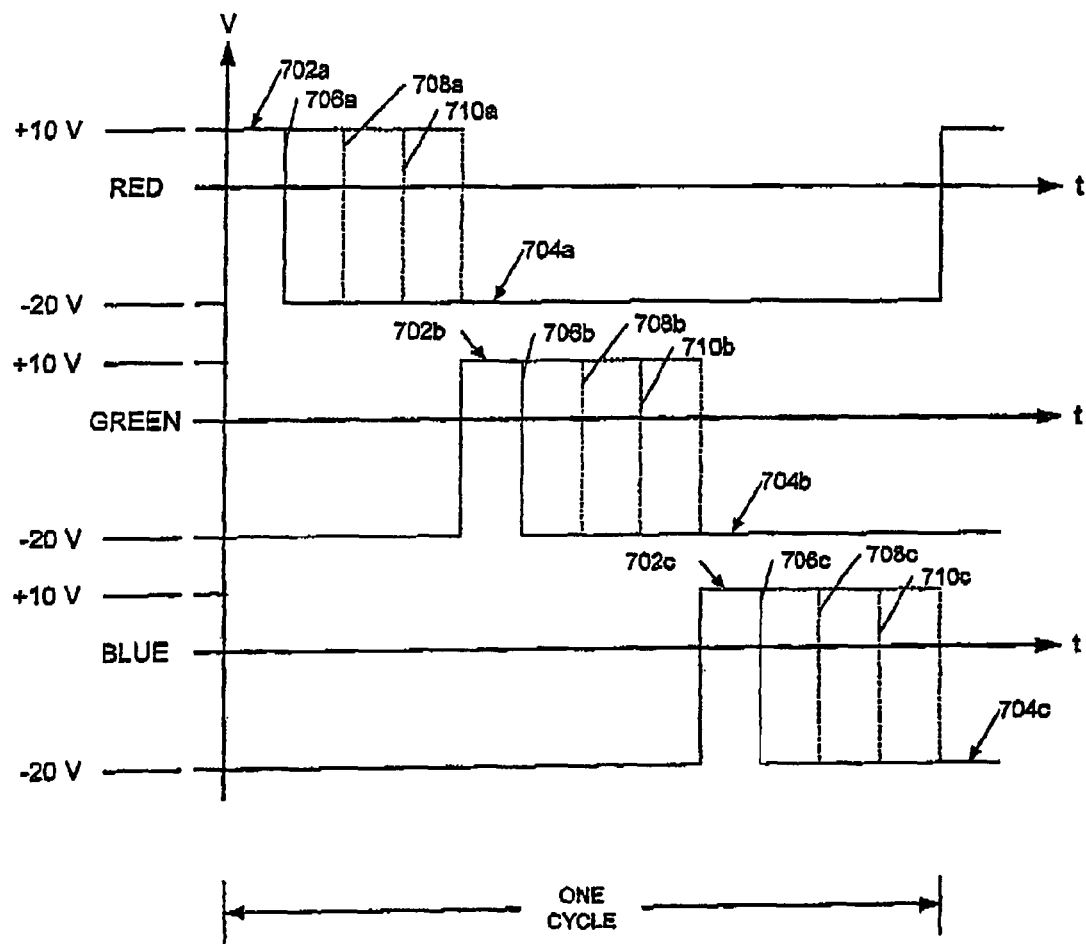
FIG. 11 shows colour pixel driving waveforms for photoluminescence quenching for improved colour gamut.

In FIG. 11 like reference numerals to those of FIG. 7 are used to denote like features, with the addition of a, b or c to denote drive waveforms for red, green and blue pixels respectively. As FIG. 11 shows, in effect with three colours the cycle is extended by a factor of three so that, say, red pixels can be reverse biased whilst green and whilst blue pixels are forward driven. This has the effect of reducing the maximum brightness of a PWM pixel by ⅓, at least for red pixels. It will be recognised that green pixels do not need to be reversed when red pixels are on and that blue pixels do not need to be reversed when red and/or green pixels are on.

Figure 4:
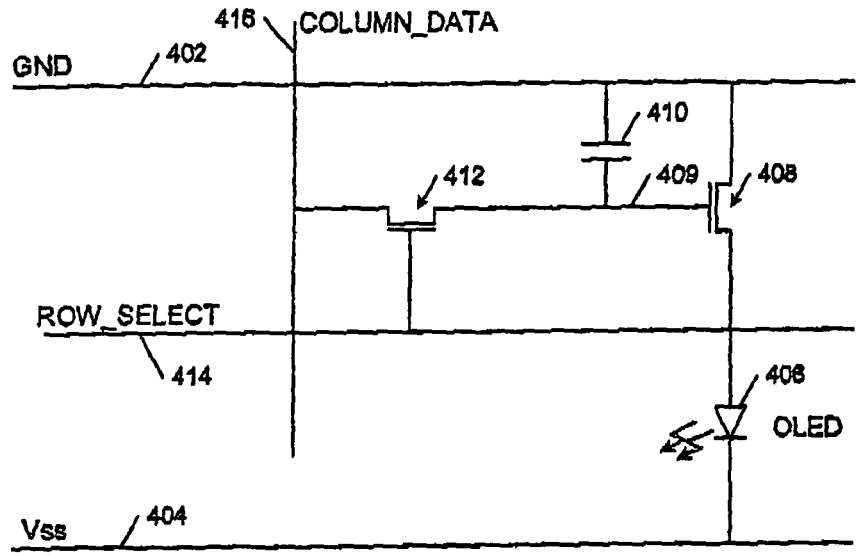
FIG. 4 shows a typical active matrix voltage-controlled OLED driver circuit.

The waveform of FIG. 11 may be generated by the display driver circuitry 504 of FIG. 5, for example operating along the lines described above with reference to driver circuits of FIG. 8a and/or 8b. Alternatively an active matrix display may be employed, for example with two pixel driver circuits of the type shown in FIG. 4 for each (colour) pixel, one as shown in FIG. 4 to provide forward bias and a second similar (but inverted) circuit to provide reverse bias. Data may then be written to the pixel driver circuits, for example, under processor control, to bias the pixel in either a forward or reverse direction.

Figure 12:
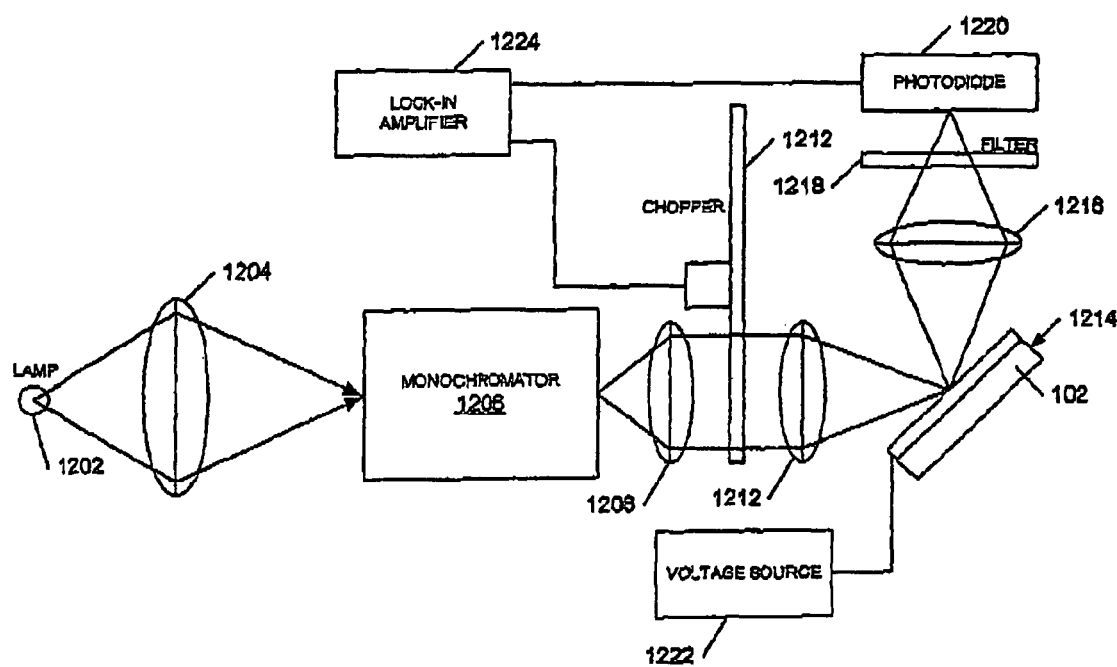
FIG. 12 shows experimental apparatus for characterising photoluminescence quenching.

Referring now to FIG. 12, this shows experimental apparatus 1200 for measuring the intensity of photoluminescence emitted by a OLED display device as revere bias is applied.

A xenon lamp 1202 is coupled by a lens 1204 to a monochromator 1206, to allow the selection of a narrow range of illuminating wavelengths. The output from monochromator 1206 is then focussed via a pair of lenses 1208, 1210 onto the display device-under-test 1214. The lenses 1208, 1210 allow the monochromator output to be modulated by a mechanical chopper wheel 1212 driven a lock-in amplifier 1224. Photoluminescence from device-under-test 1214 excited by the illumination from monochromator 1206 is collected by lens 1216 and directed onto a photodiode 1220 also coupled to lock-in amplifier 1224. The collected light is filtered by a low-pass filter 1218 which rejects scattered light from monochromator 1206 whilst allowing the photoluminescence to pass. A voltage source 1222 is used to provide a variable reverse bias voltage to device under test 1214. The lock-in amplifier 1224 provides an output indicating the level of photoluminescence from device 1214.

EXAMPLES

The results from two exemplary devices will be presented. The first comprised an 80:20 polymer blend of F8BT:TFB with a two layer calcium/aluminum cathode. The second comprised a 79:20:1 polymer blend of F8BT:TFB poly(2,7-(9,9-di-n-octylfluorene)-co(2,5-thienylene-3,6-benzothiadiazole-2,5-thienylene) with a three layer cathode of lithium fluoride/calcium/aluminum. Both devices photoluminesced in the yellow and had an intrinsic yellow colouration.

Figure 13A:
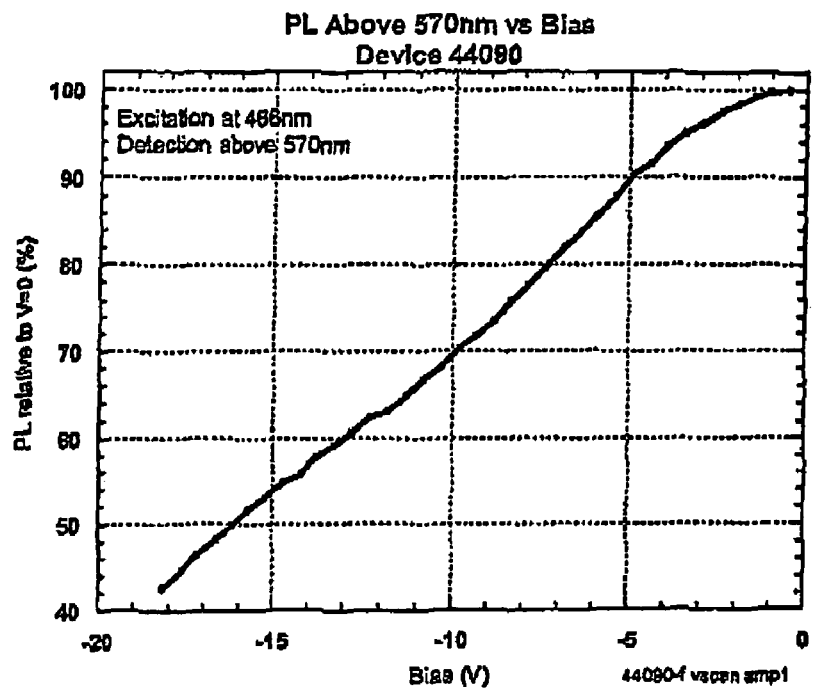
FIGS. 13a and 13b show photoluminescence quenching signals for two devices measured using the apparatus of FIG. 12.
Figure 13B:
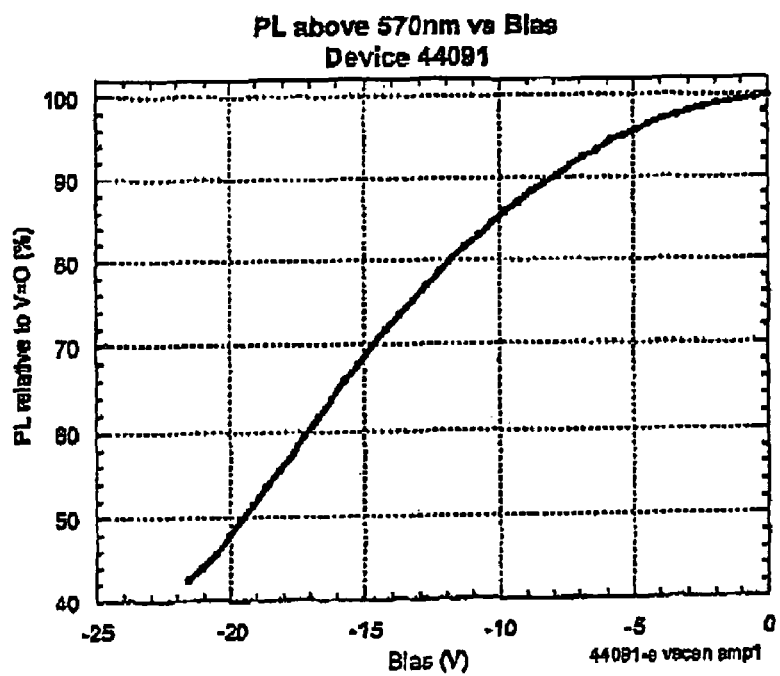

FIGS. 13a and 13b show the variation of photoluminescent emission with reverse bias for the first and second devices respectively. In each case the devices were excited using light having a wavelength of 466 nm, from monochromator 1206, and filter 1218 and photodiode 1220 were arranged to collect light of a wavelength longer than 570 nm. The two graphs have been normalised to a maximum 100% photoluminescence level at zero applied bias.

The two graphs show that with a reverse bias voltage of round 20 volts the photoluminescence is reduced to approximately half its initial value. The photoluminescence was observed to return to its original intensity once the reverse bias voltage was removed.

It will be appreciated that the reverse bias required for photoluminescence quenching depends on both the material or materials used in construction of the relevant OLED device and also upon the ambient lighting condition. Thus in some situations, for example with polymer LED-based displays, relatively low reverse bias voltages, such as −5 volts, −10 volts, 15 volts or −20 volts may be all that is required to either quench the photoluminescence or to produce a visible improvement in display contrast. Small molecule based OLED devices may require larger voltages, such as −20 volts, −30 volts, −40 volts or −50 volts. The optimum value of reverse bias for any particular display may be determined by routine experimentation, wither along the lines mentioned above or, at its simple merely turning up the reverse bias from a low or zero level and observing the display contrast visually.

Figure 14:
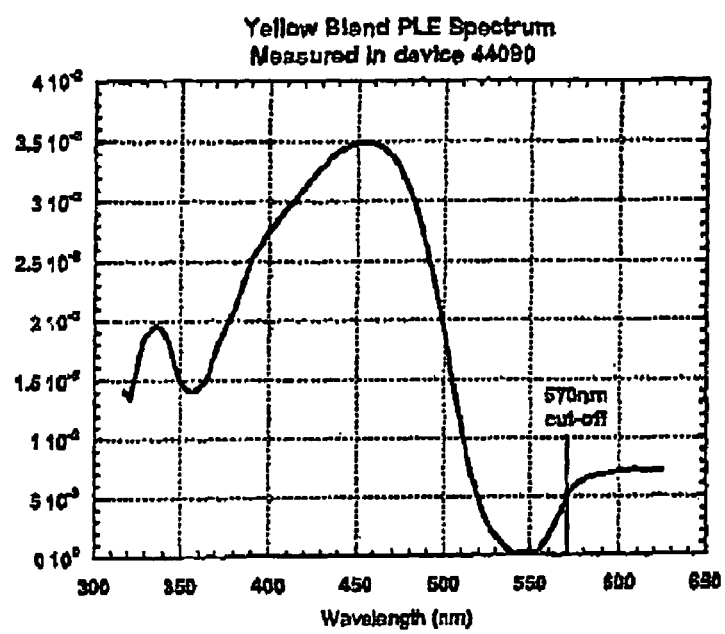

FIG. 14 shows the variation of photoluminescence intensity as a function of illuminating wavelength from monochromator 1206 for the first device. The photoluminescence is cut off when the excitation wavelength is longer than around 570 nm; the residual tail on the graph of FIG. 14 results from scattered light from the excitation source. It can be seen that the maximum photoluminescence is observed when the excitation some has a wavelength of between 400 nm and 500 nm. This characterisation assists in selecting an appropriate illumination source. The threshold for photoluminescence in the device of FIG. 14, 570 nm, corresponds to the minimum photon energy which can still generate an exciton in the photoluminescent material. Thus in devices where it is desirable to prevent photoluminescence stimulated by ambient or background light a filter cutting off at wavelengths above 570 nm placed in front of the device will reduce ambient light-stimulated photoluminescence whilst still permitting photoluminescent emission at wavelengths longer than 570 nm to pass.

Figure 15:
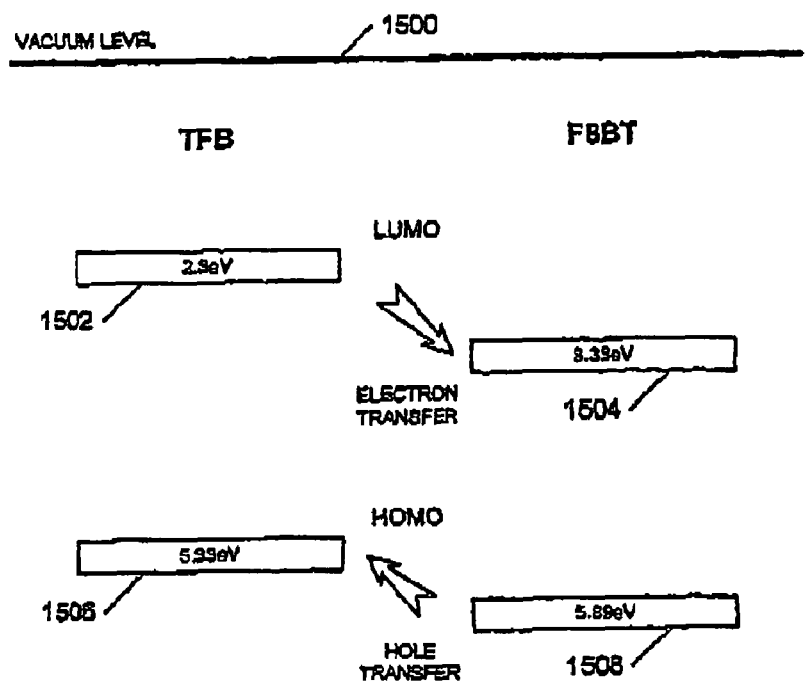
FIG. 15 shows a possible theoretical mechanism for photoluminescence quenching.

FIG. 15 illustrates a theoretical mechanism which is believed to be responsible for the photoluminescence quenching. Incident illumination causes a $\pi$-$\pi$ transition in one of the polymers, of the photoluminescent polymer blend, F8BT, generating an exciton, that is a bound hole-electron pair. This exciton may be dissociated by thermal energy greater than the exciton binding $E_b$. In an electric field the energy required to dissociate an exciton is reduced to approximately $E_b$—Xed where X is the electric field, e the charge on an electron and d the distance by which the hole and electron must be separated in order for the dissociation to be complete.

Referring again to FIG. 15, this shows the vacuum energy level 1500 and the lowest unoccupied molecular orbital (LUMO) energy levels 1502 and 1504 for TFB and F8BT respectively. FIG. 15 also shows the highest occupied molecular orbital (HOMO) energy levels 1506 and 1508 for TFB and F8BT respectively. In a simple picture, an exciton on F8BT will dissociate if the energy gained by a hole transferred to the HOMO of the TFB polymer (0.56 eV) exceeds the binding energy of the exciton on the F8BT polymer. Similarly an exciton formed on the TFB polymer will dissociate if the energy gained by transferring an electron to the LUMO of the F8BT polymer exceeds the binding energy of the exciton on the TFB polymer. It is believed that by applying a reverse bias electric field the energy needed to dissociate an exciton on the F8BT and on the TFB polymer is reduced and thus this hole/electron transfer process is activated—that is less energy is required for this transfer process and thus, at a given temperature, the process is more likely to occur. Dissociation must take place faster than radiative recombination. Measurements have determined that the estimated reduction in binding energy is consistent with the energy required to separate a hole-electron pair by a distance roughly equal to the separation between TFB and F8BT polymer chains.

The described embodiments has mainly related to applications of the invention to passive matrix displays but the skilled person will appreciate that the invention is not limited to such displays. For example contrast or colour gamut may be improved in segmented displays in which each segment has a separate drive line, or in active matrix displays in which one or more transistors associated with each pixel maintain a pixel drive level after data has been written to the pixel to set the drive level. Likewise applications of the invention are not limited to organic light emitting diode-biased displays but include other types of emissive display, such as inorganic LED-based displays.

No doubt many effective alternatives will occur to the skilled person, and it should be understood that the invention is not limited to the described embodiments but encompasses modifications apparent to those skilled in the art lying within the spirit and scope of the claims appended hereto.

The invention claimed is:

1. A display comprising:
a plurality of light emitting diode display elements, a plurality of row and column electrodes connected to said plurality of light emitting diode display elements, and a driver for the display, the driver comprising:
addressing circuitry to address said display elements;
a first driver component to cooperate with said address circuitry to provide a forward drive to at least one of said display elements to illuminate the display element;
a second driver component to provide a reverse bias drive to others of said display elements at the same time as said at least one display element is illuminated to reduce a level of photoluminescence from said others of said display elements;
a power supply to generate a voltage for said second driver component from a positive voltage supply for said first driver component;
a plurality of column switches to connect each column electrode to the first driver or to ground; and
a plurality of row switches to selectively connect each row electrode to the second driver component or to ground;
wherein the driver is configured to address said display by row-wise scanning by selectively connecting a row to ground and selectively connecting at least one column electrode to the first driver component whereby said at least one display element is illuminated;
wherein the second driver component is configured to provide sufficient reverse bias drive so that all non-scanned display elements connected to the same column electrode as said at least one illuminated display element are reverse biased even though the non-scanned display elements are connected to the first driver component which provides said forward drive to said at least one display element;

wherein the output of the second driver component is greater than the output of the first driver component and wherein the difference between the output of the second driver component and the output of the first driver component is controlled to provide a reduction in photoluminescence, with all display elements off, of at least 50% under an illuminance of at least 1000 lux from a source approximating a black body at a temperature of 5400K.

2. A display as claimed in claim 1 wherein said first driver comprises a current driver and said second driver comprises a voltage driver.

3. A display as claimed in claim 1 wherein said reverse bias drive comprises a reverse bias voltage drive of at least 5V.

4. A display as claimed in claim 1 configured to provide pulse width modulation brightness control a said display element.

5. A display as claimed in claim 1 wherein said forward drive comprises a substantially constant current drive.

6. A display as claimed in claim 1 wherein said display comprises a passive matrix display.

7. A display as claimed in claim 1 wherein said display elements comprise display elements of more than one color.

8. A display as claimed in claim 1 wherein said display elements comprise organic light emitting diodes.

9. Display driver circuitry for providing an improved contrast electroluminescent display, the electroluminescent display comprising a plurality of electroluminescent (EL) display elements, the display driver circuitry comprising:

a first driver to apply a first polarity drive to at least one first display element of said EL display elements to cause said at least one first display element to electroluminesce;

a second driver to apply a second polarity drive to at least one second display element of the EL display elements to at least partially quench photoluminescence from said at least one second display element wherein said second driver comprises a voltage generator to generate a voltage from a positive voltage power supply to said display driver circuitry, a plurality of column switches to connect each column electrode to the first polarity drive or to ground; and a plurality of row switches to selectively connect each row electrode to the second polarity drive or to ground;

wherein said first and second display elements comprise different display elements and said first and second polarity drives at least partially overlap in time, wherein the display driver circuitry is configured to address said display by row-wise scanning by selectively connecting a row to ground and selectively connecting at least one column electrode to the first polarity drive whereby said at least one display element is illuminated;

wherein the second driver is configured to provide sufficient reverse bias drive so that all non-scanned display elements connected to the same column electrode as said at least one illuminated first display element are reverse biased even though the non-scanned display elements are connected to the first driver which provides said forward drive to said at least one first display element;

wherein the output of the second driver is greater than the output of the first driver; and wherein the difference between said output of the second driver and the output of the first driver is controlled to provide a reduction in photoluminescence, with all display elements off, of at least 50% under an illuminance of at least 1000 lux from a source approximating a black body at a temperature of 5400K.

10. Display driver circuitry as claimed in claim 9 wherein said second polarity drive comprises a voltage drive of at least 5 volts.

11. Display driver circuitry as claimed in claim 9 wherein said first driver comprises a current driver and said first polarity drive comprises a substantially constant current drive.

12. Display driver circuitry as claimed in claim 11, wherein said first driver is pulse width modulatable.

13. Display driver circuitry as claimed in claim 9 wherein said display driver circuitry includes first and second electrode driver circuitry to drive first and second groups of electrodes of said display to address said display elements, and wherein said second display element comprises at least one display element sharing a said first electrode with said at least one first display element.

14. Display driver circuitry as claimed in claim 9 wherein said display is a multicolor display.

15. Display driver circuitry as claimed in claim 9 wherein said display comprises a passive matrix organic light emitting diode display.

16. Display driver circuitry as claimed in claim 9 wherein said display is an active matrix display.

17. A method of using a display driver to improve contrast in a display comprising a plurality of light emitting diode display elements addressed by row-wise scanning, the method comprising:

applying a forward bias to at least one display element to illuminate the display element and operating the display driver to reverse-bias all non-scanned non-emitting display elements to at least partially quench photoluminescence from said non-scanned non-emitting display elements whereby said display contrast is enhanced;

wherein the reverse bias is greater than an amount equal to the forward bias applied to the at least one illuminated element, wherein a reverse bias is applied to display elements except said at least one illuminated display element even when the forward bias is also applied to the display elements; and wherein a difference between the bias applied to a non-scanned non-emitting display element and the forward bias is controlled to provide a reduction in photoluminescence, with all display elements off, of at least 50% under an illuminance of at least 1000 lux from a source approximating a black body at a temperature of 5400K.

18. A method as claimed in claim 17 comprising substantially completely quenching said photoluminescence.

19. A method as claimed in claim 17 further comprising operating the display driver to forward bias emitting display elements and wherein said reverse biasing of said non-emitting display elements overlaps in time with said forward biasing of said emitting display elements.

20. A method as claimed in claim 19 wherein said display is a multicolor display, the method further comprising operating the display driver to reverse bias non-emitting display elements of a first color while forward biasing display elements of a second color, said second color being bluer or of a shorter wavelength than said first color.

21. A method as claimed in claim 17 wherein said emitting diode display elements comprise organic light emitting diode display elements.

22. A method for improving the contrast of a display comprising a plurality of light emitting diode display elements addressed by row-wise scanning, comprising:

using a display driver to apply a forward bias to at least one display element to illuminate the display element and using the display driver to reverse bias all non-emitting display elements to at least partially quench photoluminescence from said non-emitting display elements;

wherein the reverse bias is greater than an amount equal to the forward bias applied to the at least one illuminated element, wherein a reverse bias is applied to display elements except said at least one illuminated display element even when the forward bias is also applied to the display elements and wherein a difference between the reverse bias applied to a non-scanned non-emitting display element and the forward bias is controlled to provide a reduction in photoluminescence, with all display elements off, of at least 50% under an illuminance of at least 1000 lux from a source approximating a black body at a temperature of 5400K.

23. The display as claimed in claim 3, wherein said reverse bias voltage is at least 10V.

24. The display as claimed in claim 3, wherein said reverse bias voltage is at least 20V.

25. The display according to claim 1, wherein said illuminance is at least 10,000 lux.

26. The display according to claim 1, wherein said illuminance is at least 100,000 lux.

27. Driver circuitry as claimed in claim 10, wherein said drive voltage is at least 10 volts.

28. Driver circuitry as claimed in claim 10, wherein said drive voltage is at least 20 volts.

* * * * *

UNITED STATES PATENT AND TRADEMARK OFFICE
CERTIFICATE OF CORRECTION

| | |
|---|---|
| PATENT NO. | : 8,026,871 B2 |
| APPLICATION NO. | : 10/513300 |
| DATED | : September 27, 2011 |
| INVENTOR(S) | : Gunner et al. |

It is certified that error appears in the above-identified patent and that said Letters Patent is hereby corrected as shown below:

<u>On the Title Page and in the Specification:</u>

Item (54), and at Column 1, line 1, "ELECTROLUMINISCENT" should be
-- ELECTROLUMINESCENT --.
Item (54), and at Column 1, line 3, "PHOTOLUMINESENCE" should be
-- PHOTOLUMINESCENCE --.

<u>In the Specification:</u>

At Column 2, line 29, "1b," should be -- 1b. --.
At Column 6, line 65, "may configured" should be -- may be configured --.
At Column 7, line 19, "discernable" should be -- discernible --.
At Column 16, line 45, "focussed" should be -- focused --.

<u>In the Claims:</u>

At Column 19, line 19, "control a said" should be -- control of a said --.
At Column 20, line 62, "said emitting" should be -- said light emitting --.

Signed and Sealed this
Twenty-seventh Day of August, 2013

Teresa Stanek Rea
*Acting Director of the United States Patent and Trademark Office*